(12) United States Patent
Tonomura et al.

(10) Patent No.: US 9,076,755 B2
(45) Date of Patent: Jul. 7, 2015

(54) METHOD FOR PRODUCING SUBSTRATE FOR POWER MODULE WITH HEAT SINK, SUBSTRATE FOR POWER MODULE WITH HEAT SINK, AND POWER MODULE

(75) Inventors: Hiroshi Tonomura, Ibaraki (JP);
Yoshiyuki Nagatomo, Saitama (JP);
Yoshirou Kuromitsu, Urawa Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 559 days.

(21) Appl. No.: 13/394,923

(22) PCT Filed: Sep. 7, 2010
(Under 37 CFR 1.47)

(86) PCT No.: PCT/JP2010/065316
§ 371 (c)(1),
(2), (4) Date: Jul. 23, 2012

(87) PCT Pub. No.: WO2011/030754
PCT Pub. Date: Mar. 17, 2011

(65) Prior Publication Data
US 2013/0010429 A1    Jan. 10, 2013

(30) Foreign Application Priority Data

Sep. 9, 2009  (JP) ............... P2009-208438
Sep. 9, 2009  (JP) ............... P2009-208439
Nov. 2, 2009  (JP) ............... P2009-252114
Nov. 2, 2009  (JP) ............... P2009-252115

(51) Int. Cl.
*H05K 7/20* (2006.01)
*H05K 1/00* (2006.01)
(Continued)

(52) U.S. Cl.
CPC .......... *H01L 23/3735* (2013.01); *H01L 23/467* (2013.01); *H01L 23/473* (2013.01); *H01L 2224/32225* (2013.01)

(58) Field of Classification Search
CPC . H01L 23/3735; H01L 23/473; H01L 23/467; H01L 2224/32225
USPC .......... 174/252, 520, 547, 548; 257/700, 703, 257/713, 706, E23.109
See application file for complete search history.

(56) References Cited

U.S. PATENT DOCUMENTS 5,675,474 A * 10/1997 Nagase et al. ............... 361/704
8,030,760 B2 * 10/2011 Toh et al. ..................... 257/712
(Continued)

FOREIGN PATENT DOCUMENTS

CN    1473452 A    2/2004
CN    101107707 A    1/2008
(Continued)

OTHER PUBLICATIONS
Office Action mailed Jan. 7, 2014, issued for the Japanese patent application No. 2010-193893 and English translation thereof.
(Continued)

*Primary Examiner* — Hoa C Nguyen
(74) *Attorney, Agent, or Firm* — Locke Lord LLP

(57) ABSTRACT

A method for producing a substrate for a power module with a heat sink includes a heat sink bonding step for bonding a heat sink to the surface of a second metal plate. The heat sink bonding step includes: a Cu layer forming step for forming a Cu layer on at least one of the surface of the second metal plate and a bonding surface of the heat sink; a heat sink laminating step for laminating the second metal plate and the heat sink via the Cu layer; a heat sink heating step for pressing in the lamination direction and heating the second metal plate and the heat sink, to diffuse Cu in the Cu layer into the second metal plate and the heat sink; and a molten metal solidifying step for solidifying the molten metal formed with Cu diffusion, to bond the second metal plate and the heat sink.

6 Claims, 19 Drawing Sheets

(51) Int. Cl.
*H01L 23/373* (2006.01)
*H01L 23/467* (2006.01)
*H01L 23/473* (2006.01)

(56) References Cited

U.S. PATENT DOCUMENTS

| | | | |
|---|---|---|---|
| 8,273,993 B2* | 9/2012 | Kato et al. | 174/260 |
| 2002/0109152 A1* | 8/2002 | Kobayashi et al. | 257/177 |
| 2004/0022029 A1 | 2/2004 | Nagatomo et al. | |
| 2004/0264140 A1 | 12/2004 | Lucke et al. | |
| 2007/0274047 A1* | 11/2007 | Nagase et al. | 361/704 |
| 2009/0086435 A1* | 4/2009 | Suzuki et al. | 361/704 |
| 2010/0285331 A1* | 11/2010 | Kitahara et al. | 428/650 |
| 2011/0235279 A1* | 9/2011 | Mori et al. | 361/717 |

FOREIGN PATENT DOCUMENTS

| | | |
|---|---|---|
| CN | 101254561 A | 9/2008 |
| CN | 101326637 A | 12/2008 |
| JP | 04-187387 A | 7/1992 |
| JP | 11-220073 A | 8/1999 |
| JP | 2001-010874 A | 1/2001 |
| JP | 2001-018074 A | 1/2001 |
| JP | 2002-009212 A | 1/2002 |
| JP | 2003-086744 A | 3/2003 |
| JP | 2005-026252 A | 1/2005 |
| JP | 2007-013028 A | 1/2007 |
| JP | 2008-166356 A | 7/2008 |
| JP | 2009-147316 A | 7/2009 |
| WO | WO-2008/075409 A1 | 6/2008 |

OTHER PUBLICATIONS

Office Action mailed Feb. 4, 2014, issued for the Japanese patent application No. 2010-193894 and English translation thereof.
Office Action mailed Feb. 28, 2014, issued for the Chinese patent application No. 201080039784.9 and English translation thereof.
International Search Report dated Oct. 5, 2010, issued for PCT/JP2010/065316.

* cited by examiner

METHOD FOR PRODUCING SUBSTRATE FOR POWER MODULE WITH HEAT SINK, SUBSTRATE FOR POWER MODULE WITH HEAT SINK, AND POWER MODULE

TECHNICAL FIELD

The present invention relates to a method for producing a substrate for a power module with a heat sink, used in a semiconductor device that controls high current and high voltage, a substrate for a power module with a heat sink, and a power module.

Priorities are claimed on Japanese Patent Application Nos. 2009-208438 filed Sep. 9, 2009, 2009-252114 filed Nov. 2, 2009, 2009-208439 filed Sep. 9, 2009, and 2009-252115 filed Nov. 2, 2009, the contents of which are incorporated herein by reference.

BACKGROUND ART

Among semiconductor elements, power elements for supplying power have a relatively large amount of heat generation. Therefore, as a substrate mounted with the power element, a substrate for a power module with a heat sink in which a first metal plate made of Al (aluminum) is bonded on a ceramic substrate made of, for example, AlN (aluminum nitride) or $Si_3N_4$ (silicon nitride), and a heat sink is connected to an opposite side of the substrate via a second metal plate made of Al (aluminum) is used.

In the substrate for a power module with a heat sink, the first metal plate is formed as a circuit layer, and a semiconductor chip serving as a power element is mounted on the first metal plate via a solder material.

Conventionally, the substrate for a power module with a heat sink is produced according to the following procedure as described in, for example, Patent Document 1.

At first, a first metal plate is laminated on one surface of a ceramic substrate via a brazing filler metal, and a second metal plate is laminated on the other surface of the ceramic substrate via a brazing filler metal. The ceramic substrate is then pressed with a predetermined pressure in the lamination direction and heated, to bond the ceramic substrate, the first metal plate, and the second metal plate (ceramic substrate bonding step).

Then, a heat sink is laminated via a brazing filler metal on a surface of the second metal plate, which is on an opposite side to the ceramic substrate. This is pressed with a predetermined pressure in the lamination direction and heated, thereby bonding the second metal plate with a heat sink (heat sink bonding step).

That is to say, the substrate for a power module with a heat sink has been produced heretofore by the ceramic substrate bonding step and the heat sink bonding step performed subsequent thereto.

At the time of brazing the heat sink to the second metal plate, a brazing filler metal foil of Al—Si alloy containing Si in an amount of 7.5% by mass or more is frequently used in order to set the brazing temperature low. In the Al—Si alloy containing a relatively large amount of Si, it has been difficult to produce a foil material by rolling or the like due to insufficient ductibility.

Moreover, a brazing filler metal foil is arranged between the heat sink and the second metal plate, and these are pressed in the lamination direction and heated. However, the brazing filler metal foil, the heat sink, and the second metal plate need to be arranged and laminated so that the position of the brazing filler metal foil is not misaligned at the time of pressing.

Furthermore, when the brazing filler metal foil is used, an oxide layer is present on four surfaces, that is, surfaces of the second metal plate and the heat sink, and opposite surfaces of the brazing filler metal foil, in an interface between the second metal plate and the heat sink, and hence, the total thickness of the oxide film tends to increase.

PRIOR ART DOCUMENT

Patent Document

[Patent Document 1] Japanese Unexamined Patent Application, First Publication No. 2002-009212

SUMMARY OF THE INVENTION

Problems to be Solved by the Invention

In view of the above situation, it is an object of the present invention to provide: a method for producing a substrate for a power module with a heat sink that can bond a heat sink and a second metal plate strongly even if the bonding temperature in the heat sink bonding step for bonding the heat sink and the second metal plate is set low, and that can set the bonding temperature in the ceramic substrate bonding step for bonding the ceramic substrate with a first metal plate and the second metal plate relatively low, thereby enabling to provide a high quality substrate for a power module with a heat sink; the substrate for a power module with a heat sink; and a power module.

Means for Solving the Problems

A method for producing a substrate for a power module with a heat sink of the present invention is a method for producing a substrate for a power module with a heat sink that includes a ceramic substrate, a first metal plate made of aluminum with one surface being bonded to a surface of the ceramic substrate, a second metal plate made of aluminum with one surface being bonded to a rear surface of the ceramic substrate, and a heat sink made of aluminum or aluminum alloy and bonded to the other surface of the second metal plate, which is opposite to the one surface bonded to the ceramic substrate.

The method for producing the substrate for a power module with a heat sink includes:

a ceramic substrate bonding step for bonding the ceramic substrate and the first metal plate, and for bonding the ceramic substrate and the second metal plate; and a heat sink bonding step for bonding the heat sink to the other surface of the second metal plate.

The heat sink bonding step includes:

a Cu layer forming step for forming a Cu layer by fixing Cu to at least one of the other surface of the second metal plate and a bonding surface of the heat sink;

a heat sink laminating step for laminating the second metal plate and the heat sink via the Cu layer;

a heat sink heating step for pressing in the lamination direction and heating the laminated second metal plate and the heat sink, to form a molten metal area in an interface between the second metal plate and the heat sink; and a molten metal solidifying step for solidifying the molten metal area thereby bonding the second metal plate and the heat sink.

In the heat sink heating step, Cu in the Cu layer is diffused into the second metal plate and the heat sink, thereby forming the molten metal area in the interface between the second metal plate and the heat sink.

In the method for producing the substrate for a power module with a heat sink having such a configuration, Cu is interposed in a bonding interface between the second metal plate and the heat sink. Because Cu is an element that lowers the melting point of aluminum, Cu can form the molten metal area in the interface between the heat sink and the second metal plate under a relatively low temperature condition.

Accordingly, even if bonding is performed under bonding conditions of relatively low temperature and a short period of time, the heat sink and the second metal plate can be bonded strongly.

Moreover, in the heating step, because the molten metal area is formed in the interface between the heat sink and the second metal plate by diffusing Cu in the Cu layer toward the second metal plate and the heat sink, an Al—Si brazing filler metal foil that is difficult to produce need not be used. Accordingly, a substrate for a power module with a heat sink in which the second metal plate and the heat sink are reliably bonded can be produced at a low cost.

Further, because Cu is fixed to at least one of the bonding surface of the heat sink and the other surface of the second metal plate directly without using a brazing filler metal, an alignment operation of the brazing filler metal and the like need not be performed.

Furthermore, when Cu is fixed to the second metal plate and the heat sink directly, the oxide film is formed only on the surface of the second metal plate and the heat sink. Consequently, the total thickness of the oxide film present in the interface between the second metal plate and the heat sink decreases, thereby improving the yield of initial bonding.

Here, in the Cu layer forming step, one or more kinds of additive elements selected from Si, Zn, Ge, Ag, Mg, Ca, Ga, and Li may be fixed in addition to Cu to at least one of the other surface of the second metal plate and the bonding surface of the heat sink.

In this case, because elements such as Si, Zn, Ge, Ag, Mg, Ca, Ga, and Li are elements that lower the melting point of aluminum, a molten metal area can be reliably formed in the interface between the second metal plate and the heat sink under a relatively low temperature condition.

Accordingly, even if bonding is performed under bonding conditions of relatively low temperature and a short period of time, the second metal plate and the heat sink can be bonded more strongly.

Moreover, in the Cu layer forming step, Al may be fixed together with Cu.

In this case, because a Cu layer to be formed contains Al, the Cu layer melts on a preferential basis. Accordingly, a molten metal area can be reliably formed in the interface between the second metal plate and the heat sink, and the second metal plate and the heat sink can be strongly bonded. In order to fix Al together with Cu, the Cu and Al can be evaporated simultaneously or Cu—Al alloy can be sputtered as a target. Furthermore, Cu and Al can be laminated.

Moreover, the ceramic substrate bonding step may include;
a metal fixing step, a ceramic substrate laminating step, a ceramic substrate heating step, and a first molten metal and second molten metal solidifying step.

In the metal fixing step, at least one kind of Cu and Si is fixed to at least one of a bonding surface of the ceramic substrate and a bonding surface of the first metal plate in a bonding interface between the ceramic substrate and the first metal plate, thereby forming a first metal layer. Moreover, at least one kind of Cu and Si is fixed to at least one of a bonding surface of the ceramic substrate and a bonding surface of the second metal plate in a bonding interface between the ceramic substrate and the second metal plate, thereby forming a second metal layer.

In the ceramic substrate laminating step, the ceramic substrate and the first metal plate are laminated via the first metal layer. Moreover, the ceramic substrate and the second metal plate are laminated via the second metal layer.

In the ceramic substrate heating step, the laminated first metal plate, the ceramic substrate, and the second metal plate are pressed in the lamination direction and heated, to form a first molten metal area in the interface between the first metal plate and the ceramic substrate. Furthermore, a second molten metal area is formed in the interface between the ceramic substrate and the second metal plate.

In the ceramic substrate heating step, the first molten metal area is formed in the interface between the first metal plate and the ceramic substrate by diffusing at least one of Cu and Si in the first metal layer into the first metal plate. Moreover, the second molten metal area is formed in the interface between the ceramic substrate and the second metal plate by diffusing at least one of Cu and Si in the second metal layer into the second metal plate.

In this case, a brazing filler metal need not be used also in bonding between the ceramic substrate and the first metal plate and bonding between the ceramic substrate and the second metal plate, thereby enabling to reliably bond the ceramic substrate, the first metal plate, and the second metal plate at a low cost.

Moreover, in the bonding surfaces between the ceramic substrate and the first metal plate and between the ceramic substrate and the second metal plate, at least one of Cu and Si is interposed. Accordingly, even if bonding is performed under bonding conditions of relatively low temperature and a short period of time, the ceramic substrate, the first metal plate, and the second metal plate can be bonded strongly.

Here, in the metal fixing step, one or more kinds of additive elements selected from Zn, Ge, Ag, Mg, Ca, Ga, and Li may be fixed in addition to at least one of Cu and Si to at least one of the bonding surface of the ceramic substrate and the bonding surface of the second metal plate.

In this case, because elements such as Zn, Ge, Ag, Mg, Ca, Ga, and Li are elements that lower the melting point of aluminum, a first molten metal area can be reliably formed in the interface between the ceramic substrate and the first metal plate, or a second molten metal area can be reliably formed in the interface between the ceramic substrate and the second metal plate, under a relatively low temperature condition.

Accordingly, even if bonding is performed under bonding conditions of relatively low temperature and a short period of time, the ceramic substrate, the first metal plate, and the second metal plate can be bonded more strongly.

Moreover, the ceramic substrate bonding step and the heat sink bonding step may be performed simultaneously.

In this case, the cost required for bonding can be considerably reduced by simultaneously performing the heat sink laminating step and the ceramic substrate laminating step, the heat sink heating step and the ceramic substrate heating step, and the molten metal solidifying step and the first molten metal and second molten metal solidifying step, respectively. Furthermore, because heating and cooling need not be performed repeatedly, bending of the substrate for a power module with a heat sink can be reduced.

Moreover, in the Cu layer forming step, Cu may be fixed to at least one of the bonding surface of the heat sink and the other surface of the second metal plate by plating, evaporation, CVD, sputtering, cold spray, or application of ink and a paste in which powder is dispersed.

In this case, Cu can be interposed reliably in the bonding interface between the heat sink and the second metal plate. Furthermore, the fixation amount of Cu can be adjusted accurately, the molten metal area can be reliably formed, and the heat sink and the second metal plate can be bonded strongly.

Furthermore, the second metal plate may be formed by laminating a plurality of metal plates.

In this case, thermal strain due to a difference in the coefficient of thermal expansion between the heat sink and the ceramic substrate can be alleviated sufficiently by the second metal plate, thereby enabling to suppress the occurrence of cracks in the ceramic substrate.

The substrate for a power module with a heat sink of the present invention includes; a ceramic substrate, a first metal plate made of aluminum with one surface being bonded to a surface of the ceramic substrate, a second metal plate made of aluminum with one surface being bonded to a rear surface of the ceramic substrate, and a heat sink made of aluminum or aluminum alloy and bonded to the other surface of the second metal plate, which is opposite to the one surface bonded to the ceramic substrate. Cu is solid-solubilized into the second metal plate and the heat sink, and the Cu concentration in the vicinity of the bonding surface between the second metal plate and the heat sink is set to a range of from 0.05% by mass to 5% by mass inclusive.

According to the substrate for a power module with a heat sink having this configuration, because Cu is solid-solubilized respectively into the second metal plate and the heat sink, the respective portions on the bonding interface side of the second metal plate and the heat sink are solid-solution strengthened.

Here, because the Cu concentration near the bonding interface between the second metal plate and the heat sink is set to 0.05% by mass or higher, the portions on the bonding interface side between the second metal plate and the heat sink can be solid-solution strengthened reliably. Moreover, because the Cu concentration near the bonding interface between the second metal plate and the heat sink is set to 5% by mass or lower, a situation where the strength of the bonding interface between the second metal plate and the heat sink becomes excessively high can be prevented, and the thermal strain can be absorbed by the second metal plate and the heat sink.

Moreover, one or more kinds of additive elements selected from Si, Zn, Ge, Ag, Mg, Ca, Ga, and Li may be solid-solubilized in addition to Cu into the second metal plate and the heat sink.

In this case, the portions on the bonding interface side of the second metal plate and the heat sink can be solid-solution strengthened reliably.

One or more kinds of additive elements selected from Zn, Ge, Ag, Mg, Ca, Ga, and Li may be solid-solubilized in addition to at least one of Cu and Si into the vicinity of the bonding interface between the first metal plate and the ceramic substrate or the vicinity of the bonding interface between the second metal plate and the ceramic substrate.

In this case, the portions on the bonding interface side with the ceramic substrate of the first metal plate and the second metal plate can be solid-solution strengthened reliably.

Moreover, a thickness of the second metal plate may be set to be thicker than that of the first metal plate.

In this case, the rigidity of a portion of the ceramic substrate on the heat sink side can be set higher than that of a portion opposite thereto, thereby enabling to further suppress bending after being cooled.

Moreover, the second metal plate may be formed by laminating a plurality of metal plates.

In this case, thermal strain due to a difference in the coefficient of thermal expansion between the heat sink and the ceramic substrate can be alleviated sufficiently by the second metal plate, thereby enabling to suppress the occurrence of cracks in the ceramic substrate.

The power module of the present invention includes; the substrate for a power module with a heat sink, and electronic parts mounted on the substrate for a power module with a heat sink.

According to the power module having this configuration, the bonding strength between the heat sink and the second metal plate is high, and even if the use environment is severe, heat from electronic parts such as semiconductor elements can be dispersed.

Effect of the Invention

According to the present invention, it is possible to provide: a method for producing a substrate for a power module with a heat sink that can bond a heat sink and a second metal plate strongly even if the bonding temperature in the heat sink bonding step for bonding the heat sink and the second metal plate is set low, and that can set the bonding temperature in the ceramic substrate bonding step for bonding the ceramic substrate with a first metal plate and the second metal plate relatively low, thereby enabling to provide a high quality substrate for a power module with a heat sink; a substrate for a power module with a heat sink; and a power module.

BEST MODE FOR CARRYING OUT THE INVENTION

Embodiments of the present invention will be explained below with reference to the accompanying drawings.

Figure 1:
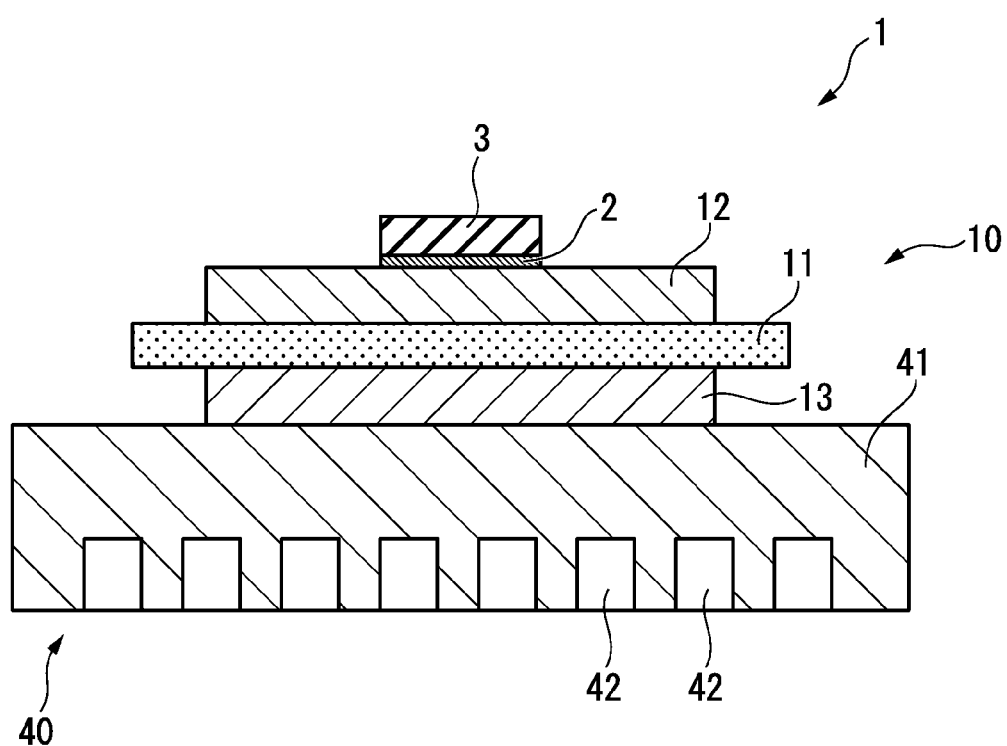
FIG. 1 is a schematic explanatory diagram of a power module using a substrate for a power module with a heat sink according to a first embodiment of the present invention.

FIG. 1 shows a substrate for a power module with a heat sink and a power module according to a first embodiment of the present invention.

A power module 1 includes; a power module substrate 10 on which a circuit layer 12 is arranged, a semiconductor chip 3 bonded to a surface of the circuit layer 12 via a solder layer 2, and a heat sink 40. The solder layer 2 is, for example, a Sn—Ag, Sn—In, or Sn—Ag—Cu solder member. In the present embodiment, a Ni plated layer (not shown) is provided between the circuit layer 12 and the solder layer 2.

The power module substrate 10 includes; a ceramic substrate 11, the circuit layer 12 arranged on one surface of the ceramic substrate 11 (upper surface in FIG. 1), and a metal layer 13 arranged on the other surface of the ceramic substrate 11 (lower surface in FIG. 1).

The ceramic substrate 11 is for preventing electric connection between the circuit layer 12 and the metal layer 13, and is made of AlN (aluminum nitride) having high insulation properties. The thickness of the ceramic substrate 11 is set to a range of from 0.2 to 1.5 mm, and the thickness thereof in the present embodiment is 0.635 mm. In the present embodiment, as shown in FIG. 1, the width of the ceramic substrate 11 is wider than the width of the circuit layer 12 and the metal layer 13.

The circuit layer 12 is formed by bonding a metal plate 22 having electrical conductivity on one surface of the ceramic substrate 11. In the present embodiment, the metal plate 22 serving as the circuit layer 12 is an aluminum rolled sheet having a purity of 99.99% or higher.

The metal layer 13 is formed by bonding a metal plate 23 to the other surface of the ceramic substrate 11. In the present embodiment, the metal plate 23 serving as the metal layer 13 is an aluminum rolled sheet having a purity of 99.99% or higher.

The heat sink 40 is for cooling the power module substrate 10 described above. The heat sink 40 includes; a top board 41 to be bonded to the power module substrate 10, and flow channels 42 for circulating a cooling medium (for example, cooling water). It is desired that the top board 41 of the heat sink 40 is made of a material having excellent thermal conductivity. In the present embodiment, the top board 41 of the heat sink 40 is made of A6063 (aluminum alloy).

Figure 2:
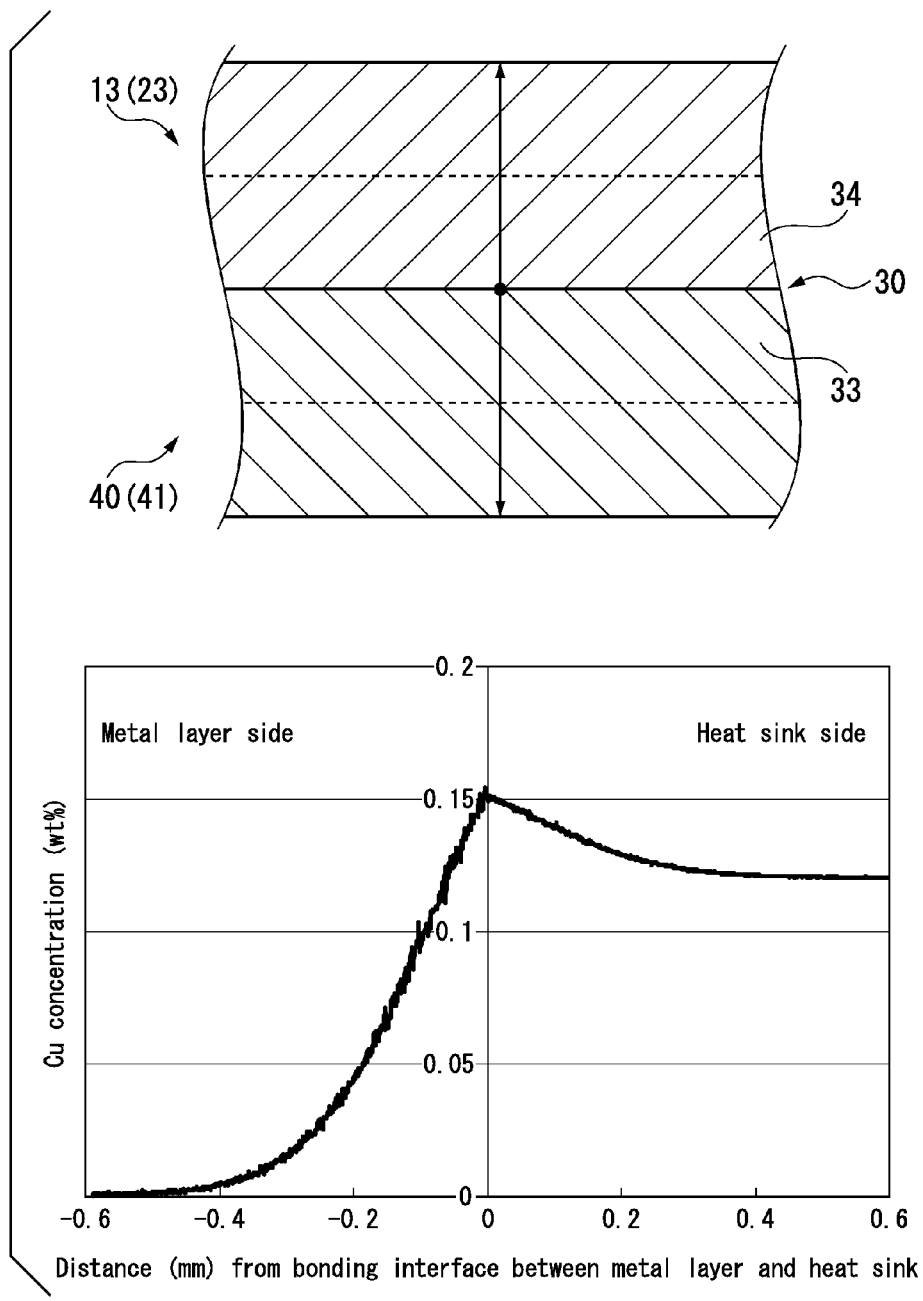
FIG. 2 is an explanatory diagram showing Cu concentration distribution in a metal layer and the heat sink of the substrate for a power module with a heat sink according to the first embodiment of the present invention.

As shown in FIG. 2, in a bonding interface 30 between the metal layer 13 (metal plate 23) and the heat sink 40, Cu is solid-solubilized into the metal layer 13 (metal plate 23) and the heat sink 40. Concentration gradient layers 33 and 34 in which Cu concentration gradually decreases with distance from the bonding interface 30 in the lamination direction are formed in the vicinity of the bonding interface 30 between the metal layer 13 and the heat sink 40. Here, Cu concentration in the concentration gradient layers 33 and 34 in the vicinity of the bonding interface 30 is set to a range of from 0.05% to 5% by mass inclusive.

The Cu concentration in the vicinity of the bonding interface 30 between the metal layer 13 and the heat sink 40 is a mean value obtained by measuring the concentration at 5 points at positions away from the bonding interface 30 by 50 µm based on EPMA analysis (spot diameter is 30 µm). Moreover, the graph in FIG. 2 is obtained by performing line analysis in the lamination direction in a central part of the width of the metal layer 13 (metal plate 23) and the heat sink 40 (top board 41) based on the concentration at the positions away from the bonding interface 30 by 50 µm.

Figure 3:
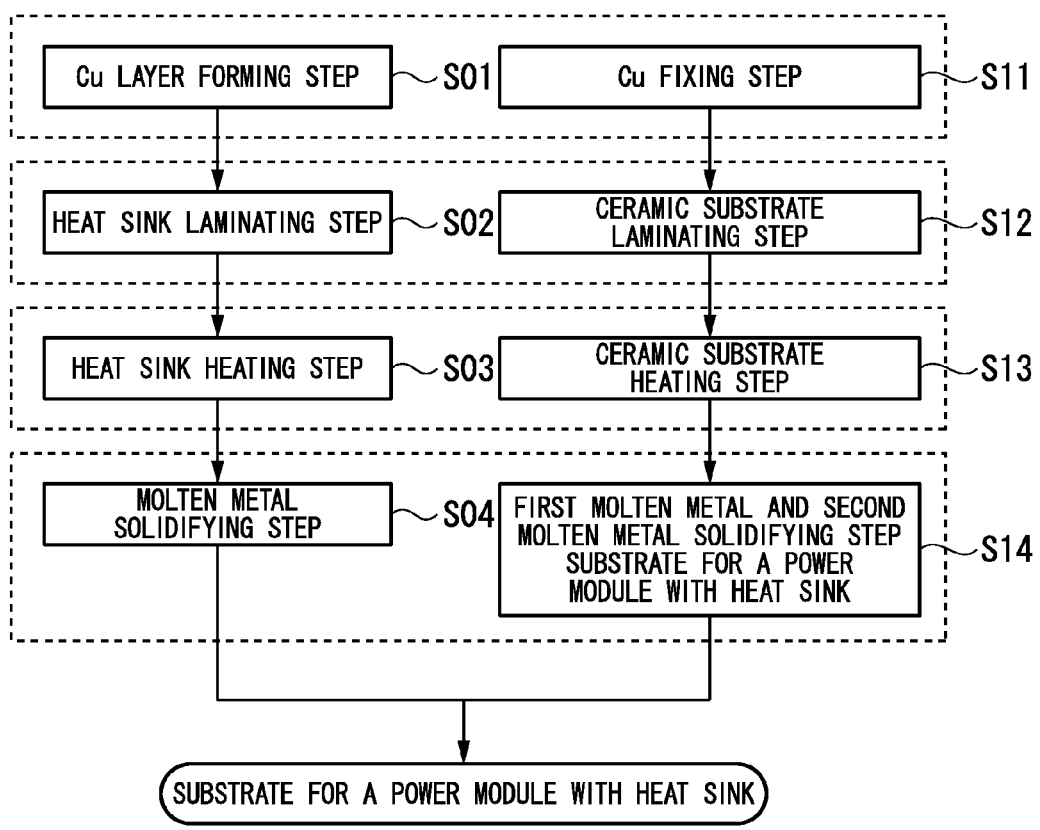
FIG. 3 is a flowchart of a method for producing the substrate for a power module with a heat sink according to the first embodiment of the present invention.

A method for producing the substrate for a power module with a heat sink having the above-described configuration will be explained below with reference to FIG. 3 to FIG. 5.

(Cu Layer Forming Step S01/Cu Fixing Step S11)

Figure 4:
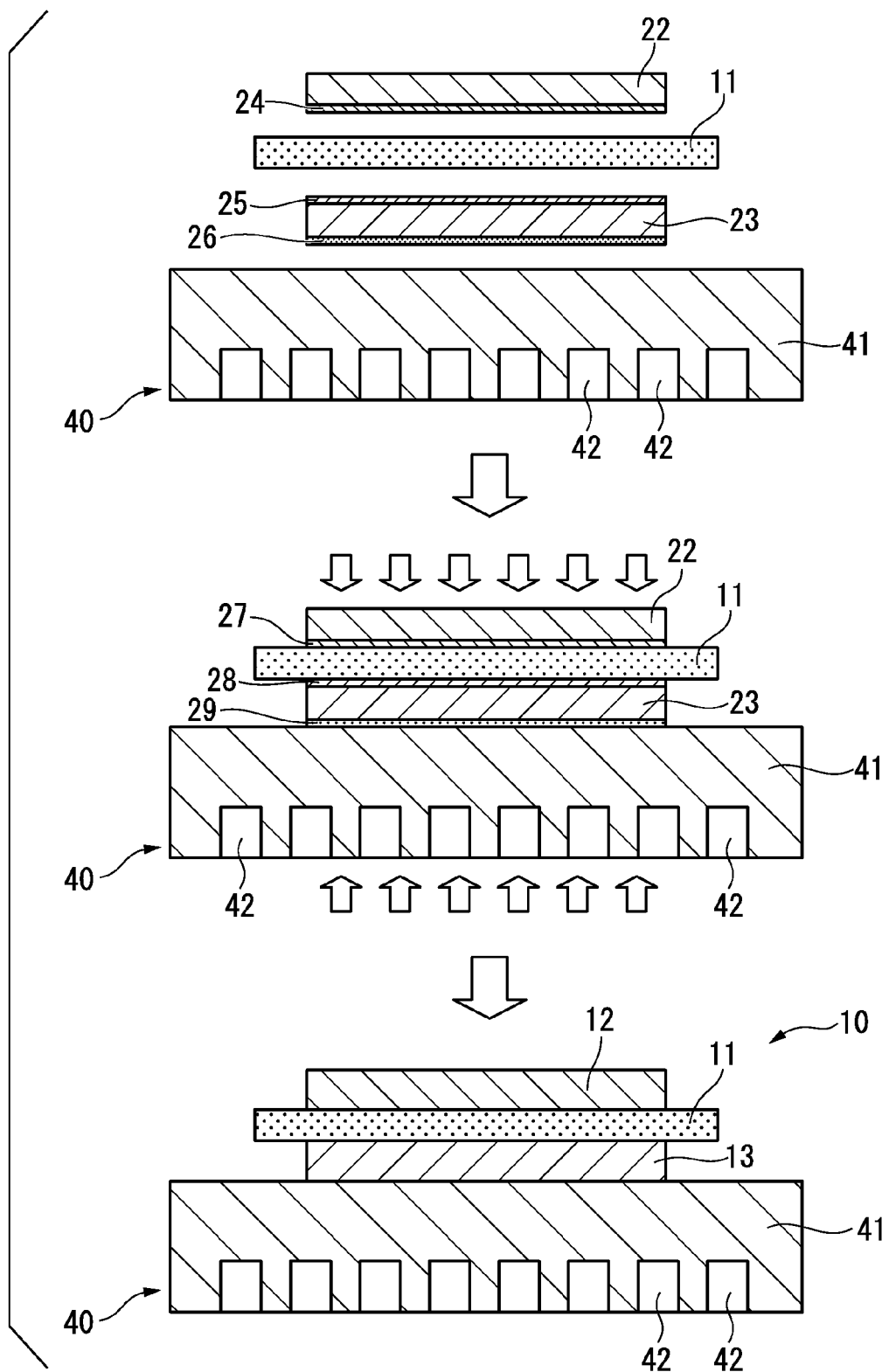
FIG. 4 is an explanatory diagram showing the method for producing the substrate for a power module with a heat sink according to the first embodiment of the present invention.
Figure 5:
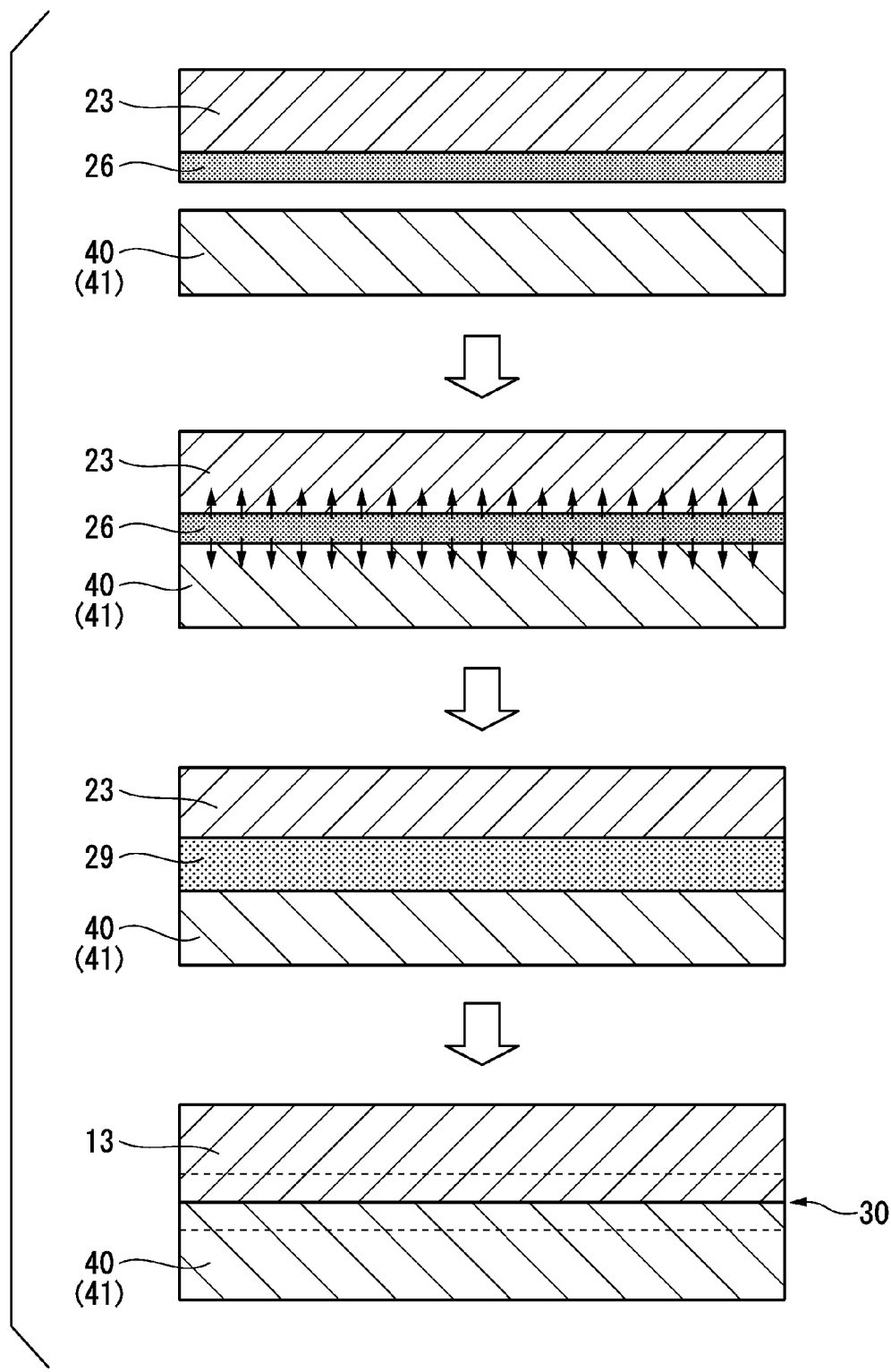
FIG. 5 is an explanatory diagram showing the vicinity of a bonding interface between a second metal plate (metal layer) and the heat sink in FIG. 4.

At first, as shown in FIG. 4 and FIG. 5, Cu is fixed to one surface of the metal plate 22 serving as the circuit layer 12 by sputtering to form a first Cu layer 24. Moreover, Cu is fixed to one surface of the metal plate 23 serving as the metal layer 13 by sputtering to form a second Cu layer 25 (Cu fixing step S11).

Furthermore, Cu is fixed to the other surface of the metal plate 23 serving as the metal layer 13 by sputtering to form a Cu layer 26 (Cu layer forming step S01).

Here, in the present embodiment, the amount of Cu in the first Cu layer 24, the second Cu layer 25, and the Cu layer 26 is set to a range of from 0.08 mg/cm$^2$ to 2.7 mg/cm$^2$ inclusive.

(Heat Sink Laminating Step S02/Ceramic Substrate Laminating Step S12)

As shown in FIG. 4, the metal plate 22 is then laminated on the one surface of the ceramic substrate 11. At this time, the metal plate 22 is laminated so that the surface of the metal plate 22, on which the first Cu layer 24 is formed, faces the ceramic substrate 11. Moreover, the metal plate 23 is laminated on the other surface of the ceramic substrate 11. At this time, the metal plate 23 is laminated so that the surface of the metal plate 23, on which the second Cu layer 25 is formed, faces the ceramic substrate 11 (ceramic substrate laminating step S12).

Furthermore, the heat sink 40 is laminated on the other surface of the metal plate 23 (heat sink laminating step S02). At this time, as shown in FIG. 4, the metal plate 23 and the heat sink 40 are laminated together so that the surface of the metal plate 23, on which the Cu layer 26 is formed, faces the heat sink 40.

(Heat Sink Heating Step S03/Ceramic Substrate Heating Step S13)

Subsequently, the metal plate 22, the ceramic substrate 11, the metal plate 23, and the heat sink 40 are charged into a vacuum heating furnace and heated in a pressed state in the lamination direction (with a pressure of 1 to 35 kgf/cm$^2$). Accordingly, a first molten metal area 27 is formed in the interface between the metal plate 22 and the ceramic substrate 11. Moreover, a second molten metal area 28 is formed in the interface between the metal plate 23 and the ceramic substrate 11 (ceramic substrate heating step S13).

Furthermore, simultaneously, a molten metal area 29 is formed between the metal plate 23 and the heat sink 40 (heat sink heating step S03).

As shown in FIG. 5, Cu in the Cu layer 26 diffuses toward the metal plate 23. Moreover, Cu in the Cu layer 26 diffuses toward the heat sink 40. Then, the Cu concentration in the metal plate 23 and the heat sink 40 in the vicinity of the Cu layer 26 increases. Accordingly, the melting points of the metal plate 23 and the heat sink 40 in the vicinity of the Cu layer 26 are lowered, thereby forming the molten metal area 29.

When the pressure is lower than 1 kgf/cm$^2$, bonding between the ceramic substrate 11 and the metal plates 22 and 23 and bonding between the metal plate 23 and the heat sink 40 may not be performed well. Moreover, when the pressure exceeds 35 kgf/cm$^2$, the metal plates 22 and 23 and the heat sink 40 may deform. As a result, pressing pressure is preferably in a range of from 1 to 35 kgf/cm$^2$.

Here, in the present embodiment, the pressure in the vacuum heating furnace is set to a range of from $10^{-6}$ Pa to $10^{-3}$ Pa inclusive. Moreover the heating temperature is set to a range of from 600° C. to 650° C. inclusive.

(Molten Metal Solidifying Step S04/First Molten Metal and Second Molten Metal Solidifying Step S14)

Subsequently, the temperature is maintained constant in a state with the molten metal area 29 being formed. Then, Cu in the molten metal area 29 diffuses toward the metal plate 23. Moreover, Cu in the molten metal area 29 diffuses toward the heat sink 40. Consequently, Cu concentration in the portion being the molten metal area 29, gradually decreases to increase the melting point, and solidification proceeds in a state with the temperature being maintained constant. That is to say, the heat sink 40 and the metal plate 23 are bonded by so-called transient liquid phase diffusion bonding. After solidification has proceeded, cooling is performed down to the normal temperature.

Also, Cu in the first molten metal area 27 and the second molten metal area 28 is diffused toward the metal plates 22 and 23. Then, Cu concentration in the portions being the first molten metal area 27 and the second molten metal area 28, gradually decreases to increase the melting point, and solidification proceeds in a state with the temperature being maintained constant. As a result, the ceramic substrate 11 and the metal plates 22 and 23 are bonded.

In the above-described manner, the metal plates 22 and 23 serving, respectively, as the circuit layer 12 and the metal layer 13, and the ceramic substrate 11 are bonded. Moreover, the metal plate 23 and the heat sink 40 are bonded. Consequently, the substrate for a power module with a heat sink according to the present embodiment is produced.

In the present embodiment having the above configuration, the Cu layer forming step S01 for forming the Cu layer 26 between the metal plate 23 serving as the metal layer 13 and the heat sink 40 is included. Therefore Cu is interposed in the bonding interface 30 between the metal plate 23 and the heat sink 40. Here, because Cu is an element having high reactivity with Al, the surfaces of the metal plate 23 and the heat sink 40 made of aluminum are activated due to the presence of Cu in the bonding interface 30. Consequently, the metal plate 23 and the heat sink 40 can be bonded strongly.

Moreover, the present embodiment includes the Cu fixing step S11 for fixing the Cu to the bonding surface between the ceramic substrate 11 and the metal plates 22 and 23. Therefore Cu is also interposed in the bonding interface between the metal plates 22 and 23 and the ceramic substrate 11, thereby enabling to strongly bond the ceramic substrate 11 and the metal plates 22 and 23.

Moreover, Cu of the Cu layer 26 formed on the other surface of the metal plate 23 is diffused toward the metal plate 23 and the heat sink 40 to form the molten metal area 29, and Cu in the molten metal area 29 is further diffused toward the metal plate 23 and the heat sink 40, to effect solidification, thereby bonding the heat sink 40 and the metal layer 13 (metal plate 23). Consequently, the heat sink 40 and the metal plate 23 can be strongly bonded, even if bonding is performed under bonding conditions of relatively low temperature and a short period of time.

Furthermore, in the present embodiment, with regard to the ceramic substrate 11 and the circuit layer 12 (metal plate 22) and the metal layer 13 (metal plate 23), Cu in the first Cu layer 24 and the second Cu layer 25 is diffused toward the metal plates 22 and 23 to form the first molten metal area 27 and the second molten metal area 28, and Cu in the first molten metal area 27 and the second molten metal area 28 is also diffused toward the metal plates 22 and 23 to effect solidification, thereby bonding the ceramic substrate 11, the circuit layer 12 (metal plate 22), and the metal layer 13 (metal plate 23). Consequently, the ceramic substrate 11, the circuit layer 12 (metal plate 22), and the metal layer 13 (metal plate 23) can be firmly bonded, even if bonding is performed under bonding conditions of relatively low temperature and a short period of time.

Furthermore, because a brazing filler metal foil is not used for bonding between the heat sink 40 and the metal plate 23 and bonding between the ceramic substrate 11 and the metal plates 22 and 23, alignment work of the brazing filler metal foil is not required. As a result, the substrate for a power module with a heat sink according to the present embodiment can be produced efficiently at a low cost.

In the present embodiment, further, bonding between the ceramic substrate 11 and the metal plates 22 and 23 and bonding between the metal plate 23 and the heat sink 40 are simultaneously performed, thereby enabling to reduce the cost required for bonding considerably. Furthermore, since heating and cooling need not be performed repeatedly with respect to the ceramic substrate 11, bending of the substrate for a power module with a heat sink can be reduced.

In the Cu layer forming step S01, further, Cu is fixed to the other surface of the metal plate 23 by sputtering to form the Cu layer 26. Therefore Cu can be reliably interposed between the heat sink 40 and the metal plate 23. Furthermore, the fixation amount of Cu can be accurately adjusted, thereby enabling to firmly bond the heat sink 40 and the metal plate 23.

Furthermore, in the substrate for a power module with a heat sink, Cu is solid-solubilized into the metal layer 13 (metal plate 23) and the heat sink 40 in the bonding interface 30 between the heat sink 40 and the metal layer 13 (metal plate 23). Respective Cu concentrations on the bonding interface 30 side of the metal layer 13 and the heat sink 40 are set to a range of from 0.05% to 5% by mass inclusive. Consequently, portions on the bonding interface 30 side of the metal layer 13 (metal plate 23) and the heat sink 40 are solid-solution strengthened, and the occurrence of cracks in the metal layer 13 (metal plate 23) and the heat sink 40 can be prevented. As a result, the substrate for a power module with a heat sink having high reliability can be provided.

Next, a substrate for a power module with a heat sink, and a power module, according to a second embodiment of the present invention will be explained with reference to FIG. 6 to FIG. 9.

A power module 101 includes; a power module substrate 110 having a circuit layer 112 arranged thereon, a semiconductor chip 3 bonded to the surface of the circuit layer 112 via a solder layer 2, and a heat sink 140.

The power module substrate 110 includes; a ceramic substrate 111, the circuit layer 112 arranged on one surface (upper surface in FIG. 6) of the ceramic substrate 111, and a metal layer 113 arranged on the other surface (lower surface in FIG. 6) of the ceramic substrate 111.

The ceramic substrate 111 is made of AlN (aluminum nitride) having high insulation properties.

The circuit layer 112 is formed by bonding a metal plate 122 made of a rolled sheet containing aluminum of 99.99% purity or higher to the ceramic substrate 111.

The metal layer 113 is formed by bonding a metal plate 123 made of a rolled sheet containing aluminum of 99.99% purity or higher to the ceramic substrate 111.

Figure 6:
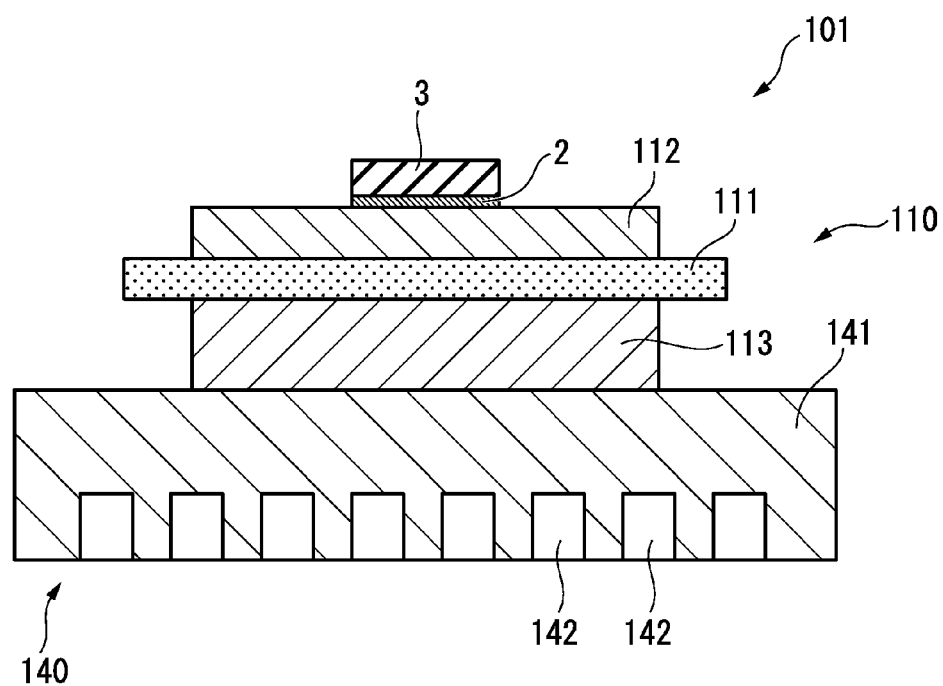
FIG. 6 is a schematic explanatory diagram of a power module using a substrate for a power module with a heat sink according to a second embodiment of the present invention.

In the present embodiment, as shown in FIG. 6, the thickness of the metal layer 113 is thicker than that of the circuit layer 112.

The heat sink 140 is for cooling the power module substrate 110 described above. The heat sink 140 includes a top board 141 to be bonded to the power module substrate 110, and flow channels 142 for circulating a cooling medium. It is desired that the top board 141 of the heat sink 140 is made of a material having excellent thermal conductivity. In the present embodiment, the top board 141 of the heat sink 140 is made of A6063 (aluminum alloy).

Figure 7:
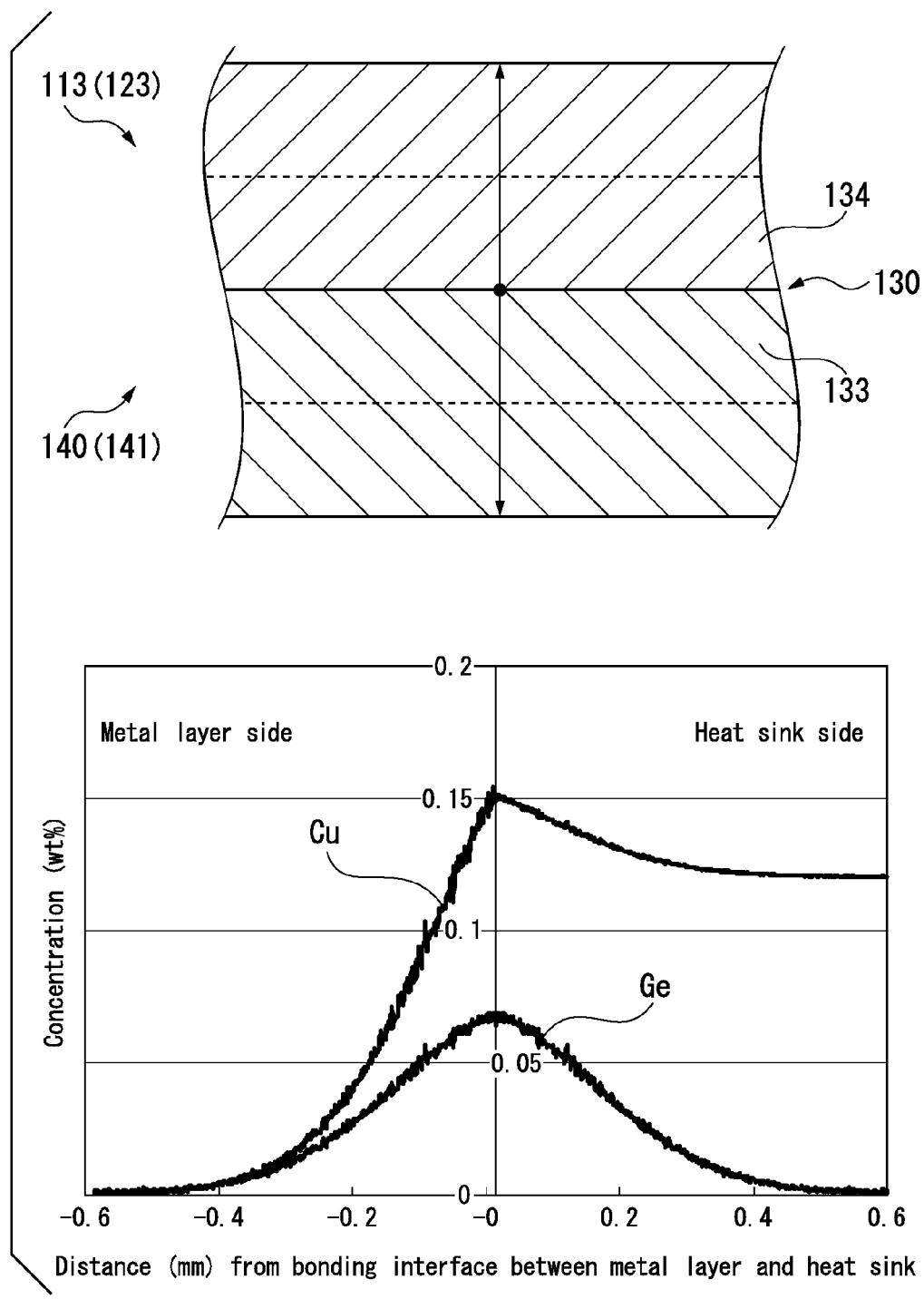
FIG. 7 is an explanatory diagram showing Cu concentration distribution and Ge concentration distribution in a metal layer and the heat sink of the substrate for a power module with a heat sink according to the second embodiment of the present invention.

As shown in FIG. 7, in a bonding interface 130 between the metal layer 113 (metal plate 123) and the heat sink 140, one or more kinds of additive elements selected from Zn, Ge, Ag, Mg, Ca, Ga, and Li are solid-solubilized in addition to Cu into the metal layer 113 (metal plate 123) and the heat sink 140. In the present embodiment, Ge is solid-solubilized as the additive element.

Moreover, in a bonding interface between the circuit layer 112 (metal plate 122) and the ceramic substrate 111 and in a bonding interface between the metal layer 113 (metal plate 123) and the ceramic substrate 111, one or more kinds of additive elements selected from Zn, Ge, Ag, Mg, Ca, Ga, and Li are solid-solubilized in addition to Cu, and in the present embodiment, Ge is solid-solubilized as the additive element.

Here, concentration gradient layers 133 and 134 in which Cu concentration and Ge concentration gradually decrease with distance from the bonding interface 130 in the lamination direction are formed near the bonding interface 130 between the metal layer 113 and the heat sink 140. Here, the total concentration of Cu and the additive element (Ge in the present embodiment) in the vicinity of the bonding interface 130 between the concentration gradient layers 133 and 134 is set to a range of from 0.05% to 6.5% by mass inclusive.

The Cu concentration and the Ge concentration in the vicinity of the bonding interface 130 between the metal layer 113 and the heat sink 140 are, respectively, a mean value obtained by measuring the concentration at 5 points away from the bonding interface 130 by 50 μm based on EPMA analysis (spot diameter is 30 μm). Moreover, the graph in FIG. 7 is obtained by performing line analysis in the lamination direction in a central part of the width of the metal layer 113 (metal plate 123) and the heat sink 140 (top board 141) based on the concentration at the positions away from the bonding interface 130 by 50 μm.

Figure 8:
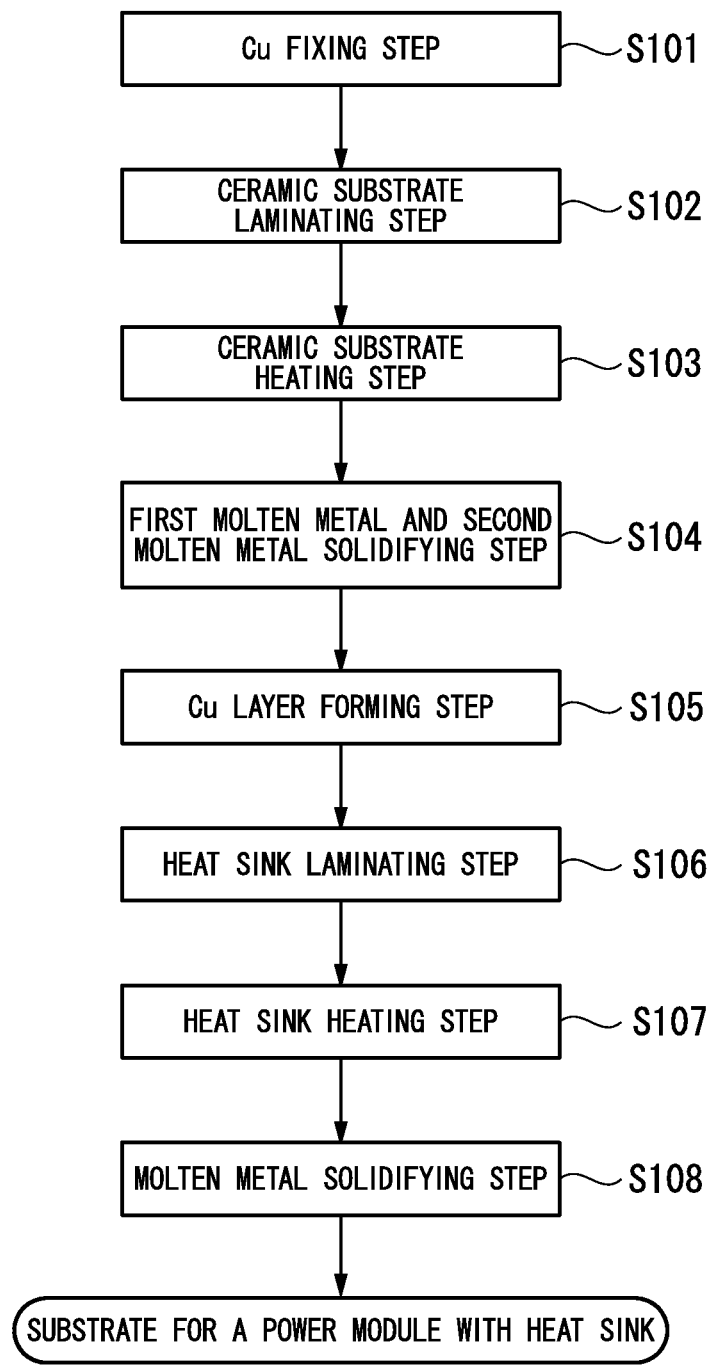
FIG. 8 is a flowchart of a method for producing the substrate for a power module with a heat sink according to the second embodiment of the present invention.

A method for producing the substrate for a power module with a heat sink having the above-described configuration will be explained below with reference to FIG. 8 and FIG. 9.
(Cu Fixing Step S101)

Figure 9:
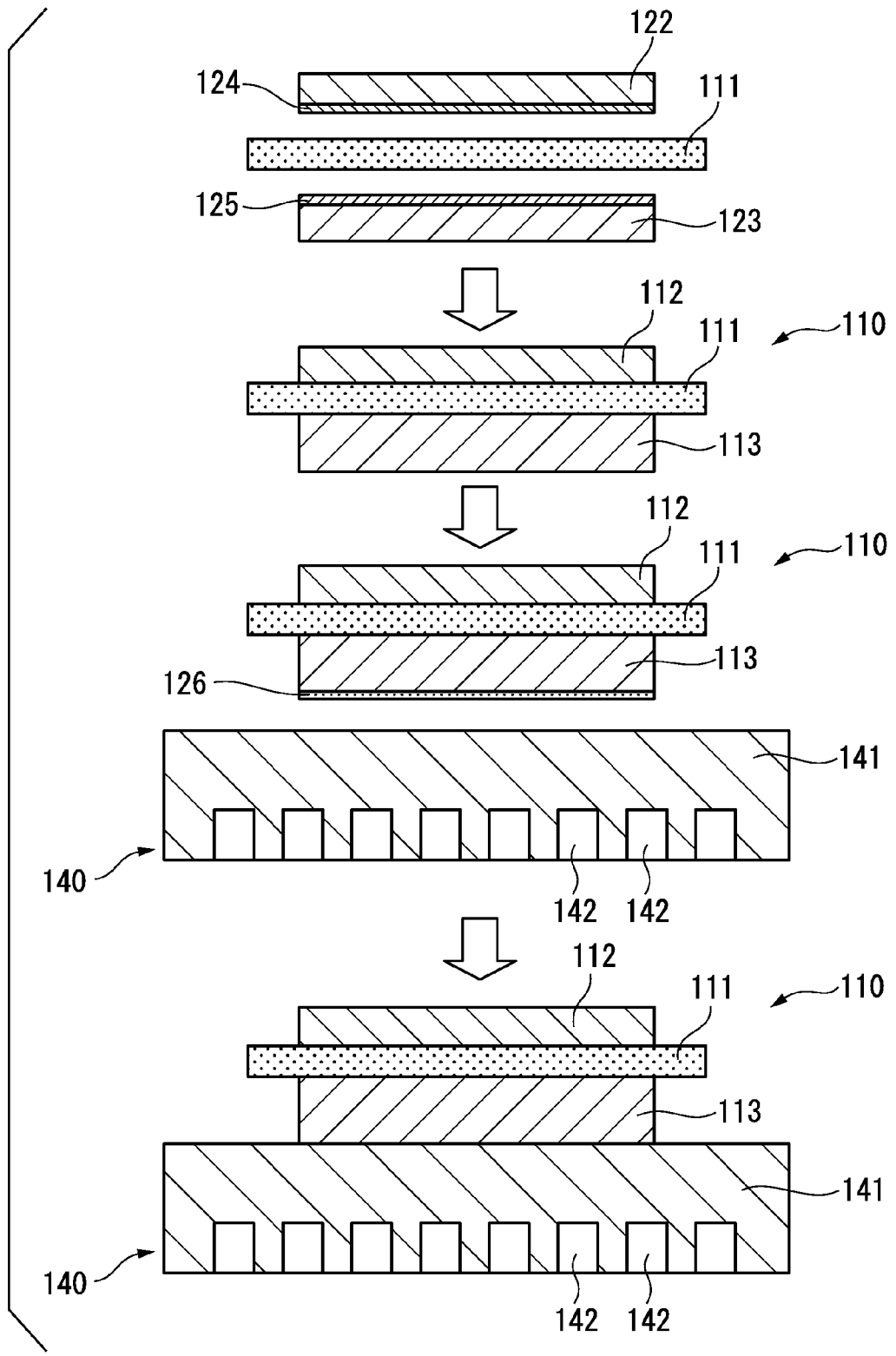
FIG. 9 is an explanatory diagram showing the method for producing the substrate for a power module with a heat sink according to the second embodiment of the present invention.
Figure 10:
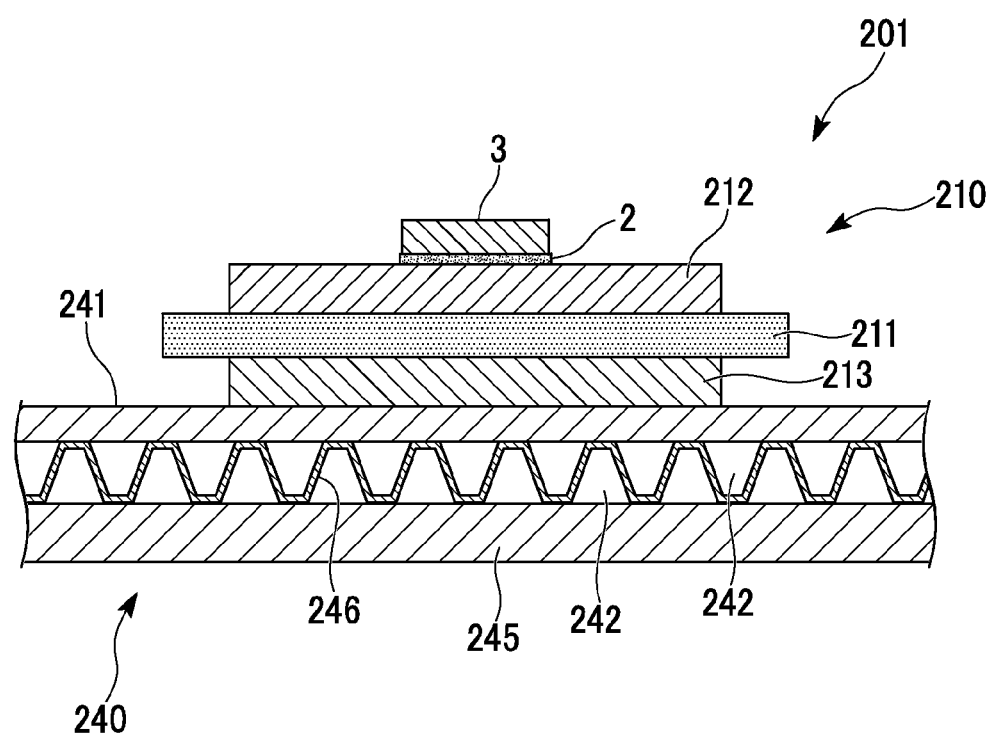
FIG. 10 is a schematic explanatory diagram of a power module using a substrate for a power module with a heat sink according to a third embodiment of the present invention.

At first, as shown in FIG. 9, Cu is fixed to one surface of the metal plate 122 serving as the circuit layer 112 by sputtering to form a first Cu layer 124. Moreover, Cu is fixed to one surface of the metal plate 123 serving as the metal layer 113 by sputtering to form a second Cu layer 125. One or more kinds of additive elements selected from Zn, Ge, Ag, Mg, Ca, Ga, and Li are fixed in addition to Cu to the first Cu layer 124 and the second Cu layer 125. In the present embodiment, Ge is used as the additive element.
(Ceramic Substrate Laminating Step S102)

Subsequently, the metal plate 122 is laminated on one surface of the ceramic substrate 111. At this time, the metal plate 122 is laminated so that the surface of the metal plate 122, on which the first Cu layer 124 is formed, faces the ceramic substrate 111. Moreover, the metal plate 123 is laminated on the other surface of the ceramic substrate 111. At this time, the metal plate 123 is laminated so that the surface of the metal plate 123, on which the second Cu layer 125 is formed, faces the ceramic substrate 111.
(Ceramic Substrate Heating Step S103)

Subsequently, the metal plate 122, the ceramic substrate 111, and the metal plate 123 are charged into a vacuum heating furnace and heated in a pressed state in the lamination direction (with a pressure of 1 to 35 kgf/cm$^2$). A first molten metal area is formed in the interface between the metal plate 122 and the ceramic substrate 111. Moreover, a second molten metal area is formed in the interface between the metal plate 123 and the ceramic substrate 111.

Here, in the present embodiment, the pressure in the vacuum heating furnace is set to a range of from $10^{-6}$ Pa to $10^{-3}$ Pa inclusive and the heating temperature is set to a range of from 600° C. to 650° C. inclusive.
(First Molten Metal and Second Molten Metal Solidifying Step S104)

Subsequently, while the temperature is maintained constant in a state with the first molten metal area and the second molten metal area being formed, Cu in the first molten metal area and the second molten metal area is diffused toward the metal plates 122 and 123, to cause solidification in a state with the temperature being maintained constant, thereby bonding the ceramic substrate 111 and the metal plates 122 and 123. In this manner, the power module substrate 110 is produced.
(Cu Layer Forming Step S105/Heat Sink Laminating Step S106)

Subsequently, Cu and Ge are fixed to the other surface of the metal layer 113 of the power module substrate 110 to form a Cu layer 126. The amount of Cu in the Cu layer 126 is set to a range of from 0.08 mg/cm$^2$ to 2.7 mg/cm$^2$ inclusive, and the amount of Ge is set to a range of from 0.002 mg/cm$^2$ to 2.5 mg/cm$^2$ inclusive.

Moreover, the heat sink 140 is laminated on the other surface of the metal layer 113 via the Cu layer 126.
(Heat Sink Heating Step S107)

Subsequently, the power module substrate 110 and the heat sink 140 are charged into a vacuum heating furnace and heated in a pressed state in the lamination direction (with a pressure of 1 to 35 kgf/cm$^2$) to form a molten metal area between the metal layer 113 and the heat sink 140.

Here, in the present embodiment, the pressure in the vacuum heating furnace is set to a range of from $10^{-6}$ Pa to $10^{-3}$ Pa inclusive. The heating temperature is set to a range of from 600° C. to 650° C. inclusive.

(Molten Metal Solidifying Step S108)

Subsequently, the temperature is maintained constant in a state with the molten metal area being formed. Then, Cu and Ge in the molten metal area diffuse toward the metal layer 113 and the heat sink 140. Then, Cu concentration and Ge concentration in the portion being the molten metal area, gradually decrease to increase the melting point, and solidification proceeds in a state with the temperature being maintained constant. After solidification has proceeded in this manner, cooling is performed down to the normal temperature.

In this manner, the power module substrate 110 and the heat sink 140 are bonded and the substrate for a power module with a heat sink according to the present embodiment is produced.

In the present embodiment having the above-described configuration, because Ge is fixed together with Cu to between the heat sink 140 and the metal layer 113, the molten metal area can be formed by diffusing Cu and Ge. Moreover, the heat sink 140 and the power module substrate 110 can be bonded by diffusing Cu and Ge in the molten metal area. As a result, even under a relatively low temperature condition, the heat sink 140 and the power module substrate 110 can be reliably bonded.

Moreover, because Ge is added in addition to Cu, and Cu and Ge are diffused to form the molten metal area, the melting point in the vicinity of the bonding interface 130 between the heat sink 140 and the metal layer 113 can be further decreased. As a result, even if the bonding temperature in the heat sink heating step S107 is set lower than that in the ceramic substrate heating step S103, the heat sink 140 and the power module substrate 110 can be bonded.

Furthermore, in the present embodiment, because the thickness of the metal layer 113 is set thicker than that of the circuit layer 112, the rigidity of the metal layer 113 side is set higher than that of the circuit layer 112 side based on the ceramic substrate 111 as a reference, thereby enabling to suppress bending of the substrate for a power module with a heat sink after bonding.

Next, a substrate for a power module with a heat sink, and a power module, according to a third embodiment of the present invention will be explained with reference to FIG. 10 to FIG. 14.

A power module 201 includes; a power module substrate 210 having a circuit layer 212 arranged thereon, a semiconductor chip 3 bonded to the surface of the circuit layer 212 via a solder layer 2, and a heat sink 240.

The power module substrate 210 includes; a ceramic substrate 211, the circuit layer 212 arranged on one surface (upper surface in FIG. 10) of the ceramic substrate 211, and a metal layer 213 arranged on the other surface (lower surface in FIG. 10) of the ceramic substrate 211. The ceramic substrate 211 is made of AlN (aluminum nitride) having high insulation properties.

The circuit layer 212 is formed by bonding a metal plate 222 made of a rolled sheet containing aluminum of 99.99% purity or higher to the ceramic substrate 211.

The metal layer 213 is formed by bonding a metal plate 223 made of a rolled sheet containing aluminum of 99.99% purity or higher to the ceramic substrate 211.

The heat sink 240 is for cooling the power module substrate 210 described above. The heat sink 240 according to the present embodiment includes a top board 241 to be bonded to the power module substrate 210, a bottom board 245 arranged so as to face the top board 241, and corrugated fins 246 placed between the top board 241 and the bottom board 245. Flow channels 242 through which a cooling medium is circulated are defined by the top board 241, the bottom board 245, and the corrugated fins 246.

Figure 14:
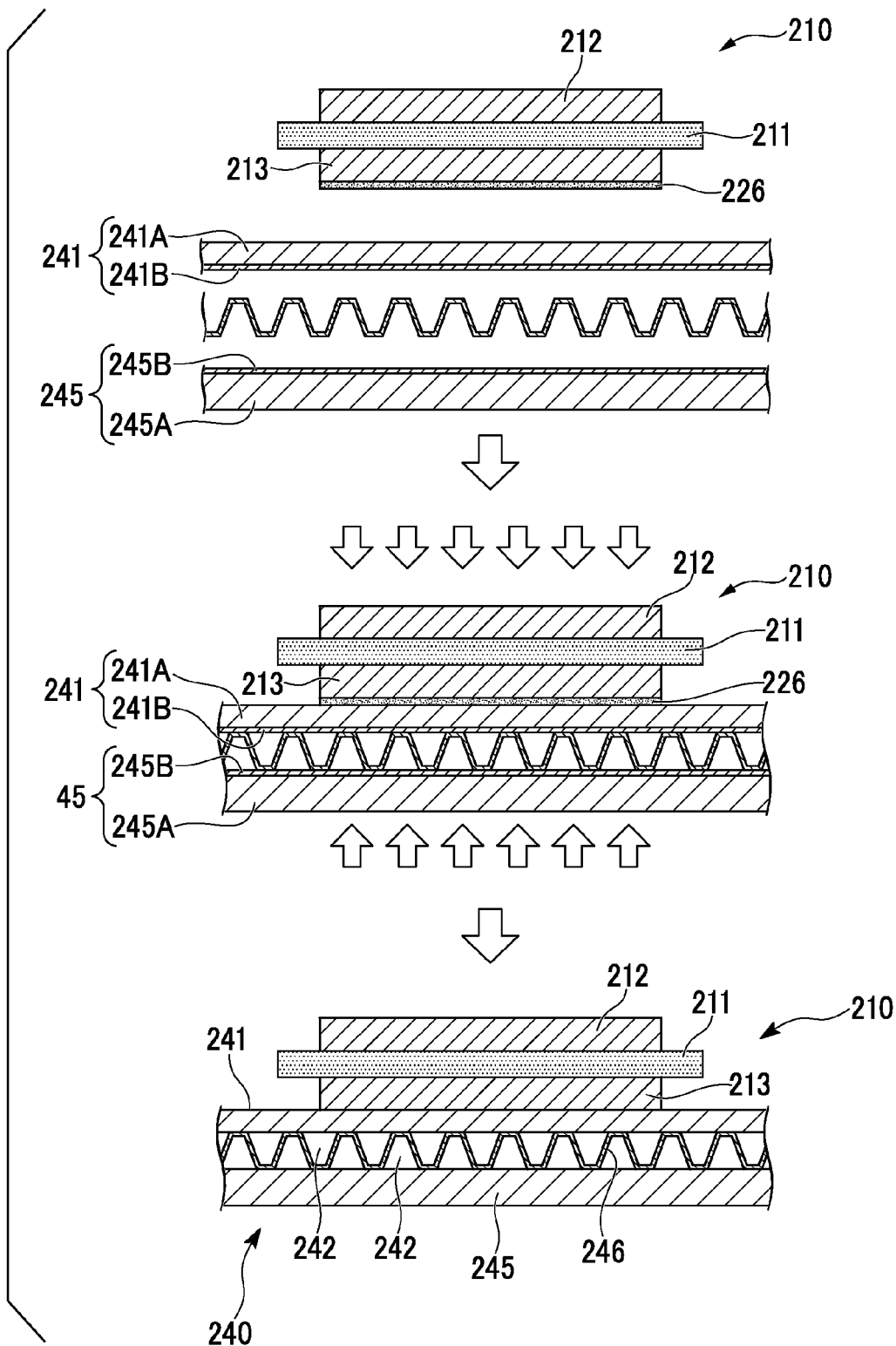
FIG. 14 is an explanatory diagram showing the method for producing the substrate for a power module with a heat sink according to the third embodiment of the present invention.
Figure 15:
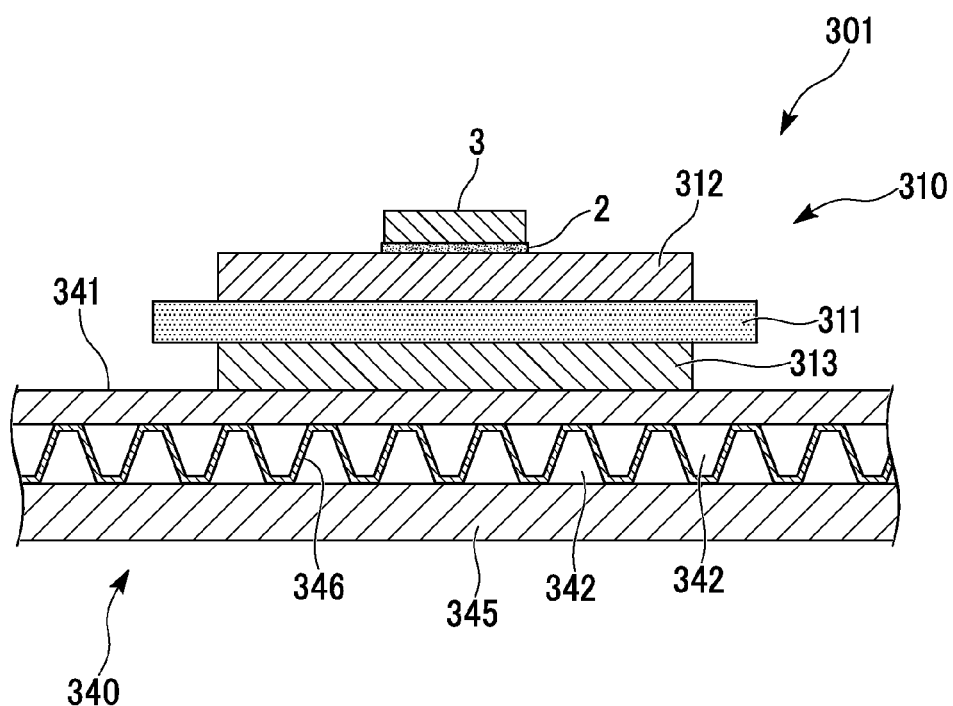
FIG. 15 is a schematic explanatory diagram of a power module using a substrate for a power module with a heat sink according to a fourth embodiment of the present invention.
Figure 16:
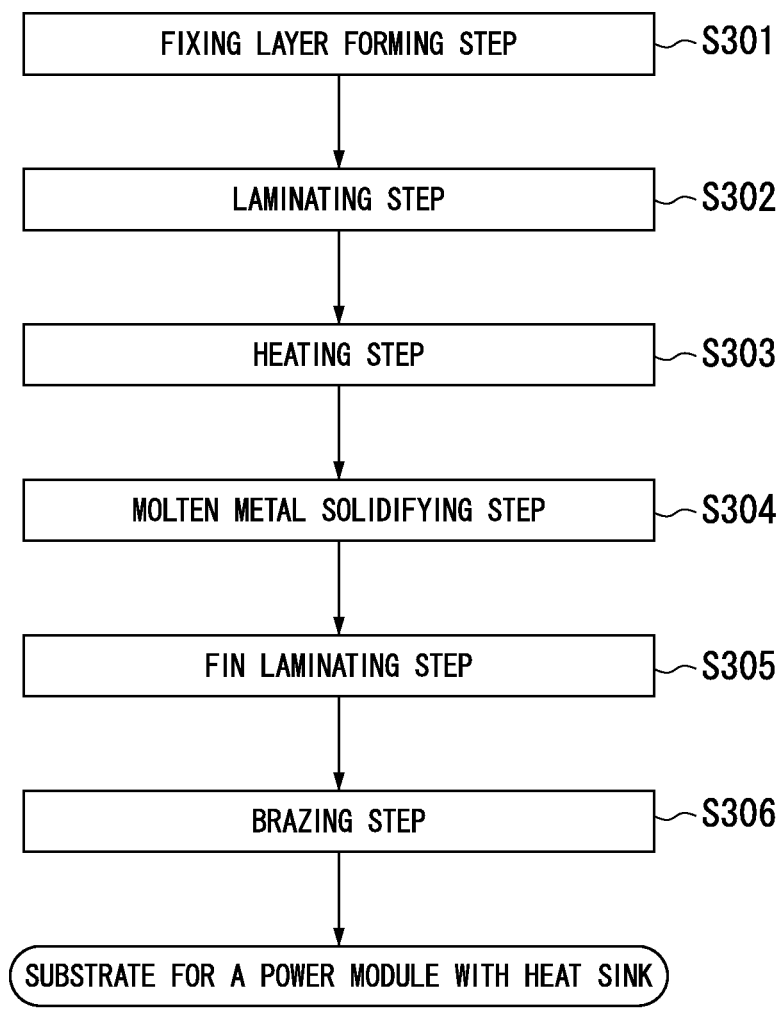
FIG. 16 is a flowchart of a method for producing the substrate for a power module with a heat sink according to the fourth embodiment of the present invention.

The heat sink 240 is formed by brazing the top board 241 and the corrugated fins 246, and the corrugated fins 246 and the bottom board 245, respectively. In the present embodiment, as shown in FIG. 14, the top board 241 and the bottom board 245 are formed of a laminated aluminum board in which base material layers 241A and 245A made of A3003 alloy and bonding layers 241B and 245B made of A4045 alloy are laminated, and the top board 241 and the bottom board 245 are arranged so that the bonding layers 241B and 245B face the corrugated fins 246.

Figure 11:
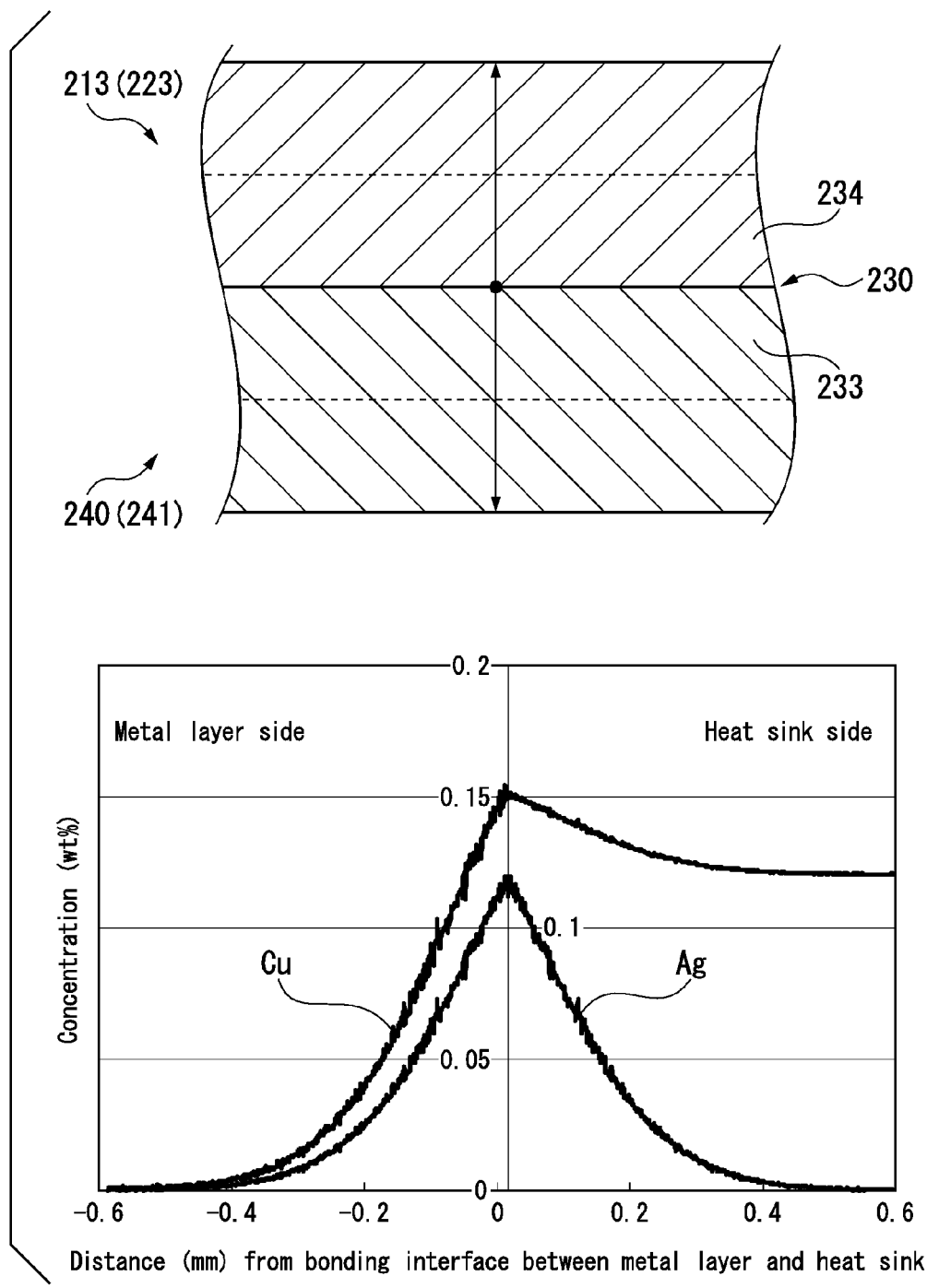
FIG. 11 is an explanatory diagram showing Cu concentration distribution and Ag concentration distribution in a metal layer and a heat sink of the substrate for a power module with a heat sink according to the third embodiment of the present invention.
Figure 12:
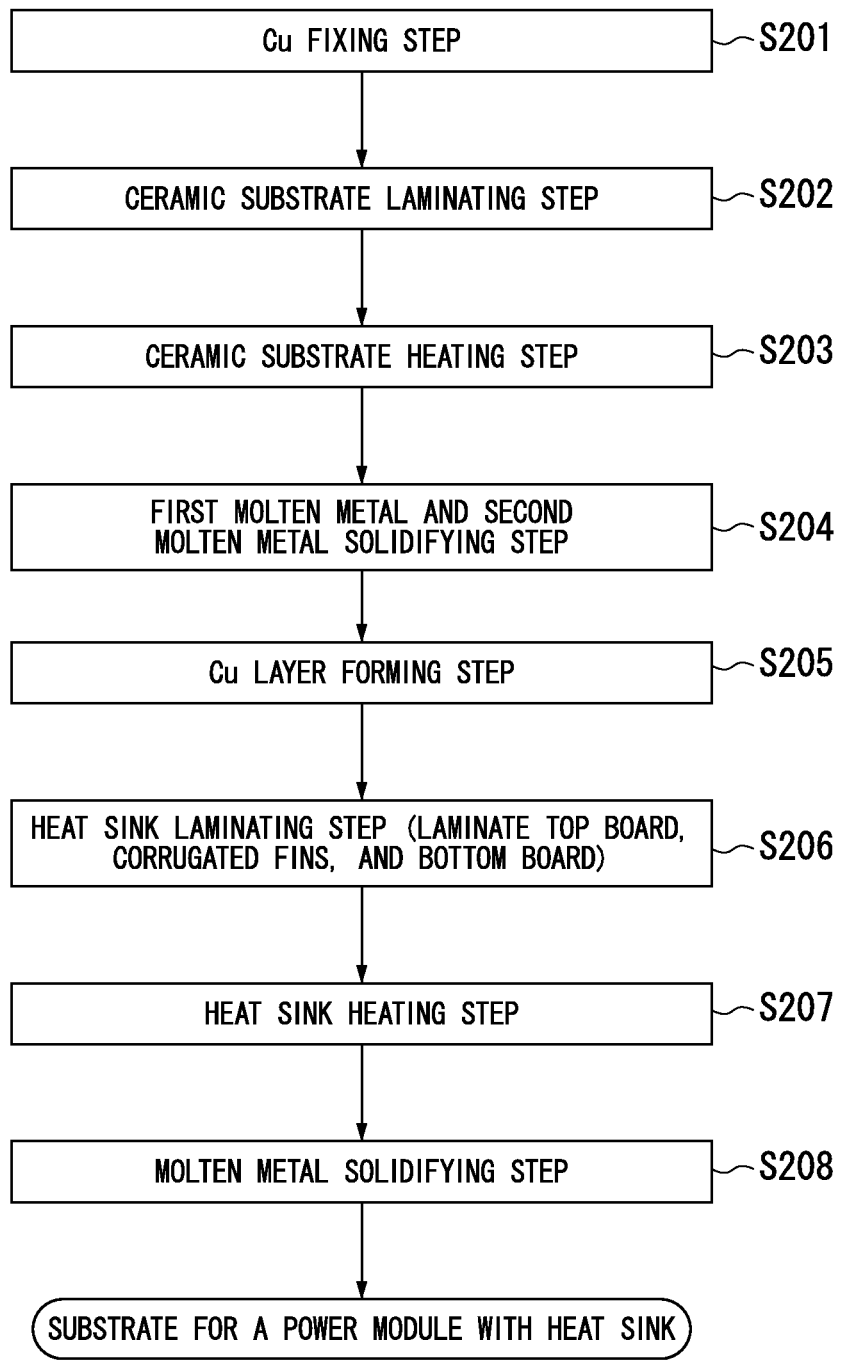
FIG. 12 is a flowchart of a method for producing the substrate for a power module with a heat sink according to the third embodiment of the present invention.

As shown in FIG. 11, in a bonding interface 230 between the heat sink 240 (base material layer 241A of the top board 241) and the metal layer 213 (metal plate 223), one or more kinds of additive elements selected from Zn, Ge, Ag, Mg, Ca, Ga, and Li are solid-solubilized in addition to Cu into the metal layer 213 (metal plate 223) and the heat sink 240 (base material layer 241A of the top board 241). In the present embodiment, Ag is solid-solubilized as the additive element.

In a bonding interface between the circuit layer 212 (metal plate 222) and the ceramic substrate 211 and in a bonding interface between the metal layer 213 (metal plate 223) and the ceramic substrate 211, one or more kinds of additive elements selected from Zn, Ge, Ag, Mg, Ca, Ga, and Li are solid-solubilized in addition to Cu, and in the present embodiment, Ag is solid-solubilized as the additive element.

Here, concentration gradient layers 233 and 234 in which Cu concentration and Ag concentration gradually decrease with distance from the bonding interface 230 in the lamination direction are formed near the bonding interface 230 between the metal layer 213 and the heat sink 240. Here, the total concentration of Cu and the additive element (Ag in the present embodiment) in the vicinity of the bonding interface 230 between the concentration gradient layers 233 and 234 is set to a range of from 0.05% to 6.5% by mass inclusive.

The Cu concentration and the Ag concentration in the vicinity of the bonding interface 230 between the metal layer 213 and the heat sink 240 are, respectively, a mean value obtained by measuring the concentration at 5 points away from the bonding interface 230 by 50 µm based on EPMA analysis (spot diameter is 30 µm). Moreover, the graph in FIG. 11 is obtained by performing line analysis in the lamination direction in a central part of the width of the metal layer 213 (metal plate 223) and the heat sink 240 (top board 241) based on the concentration at the positions away from the bonding interface 230 by 50 µm.

A method for producing the substrate for a power module with a heat sink having the above-described configuration will be explained below.

(Cu Fixing Step S201)

Figure 13:
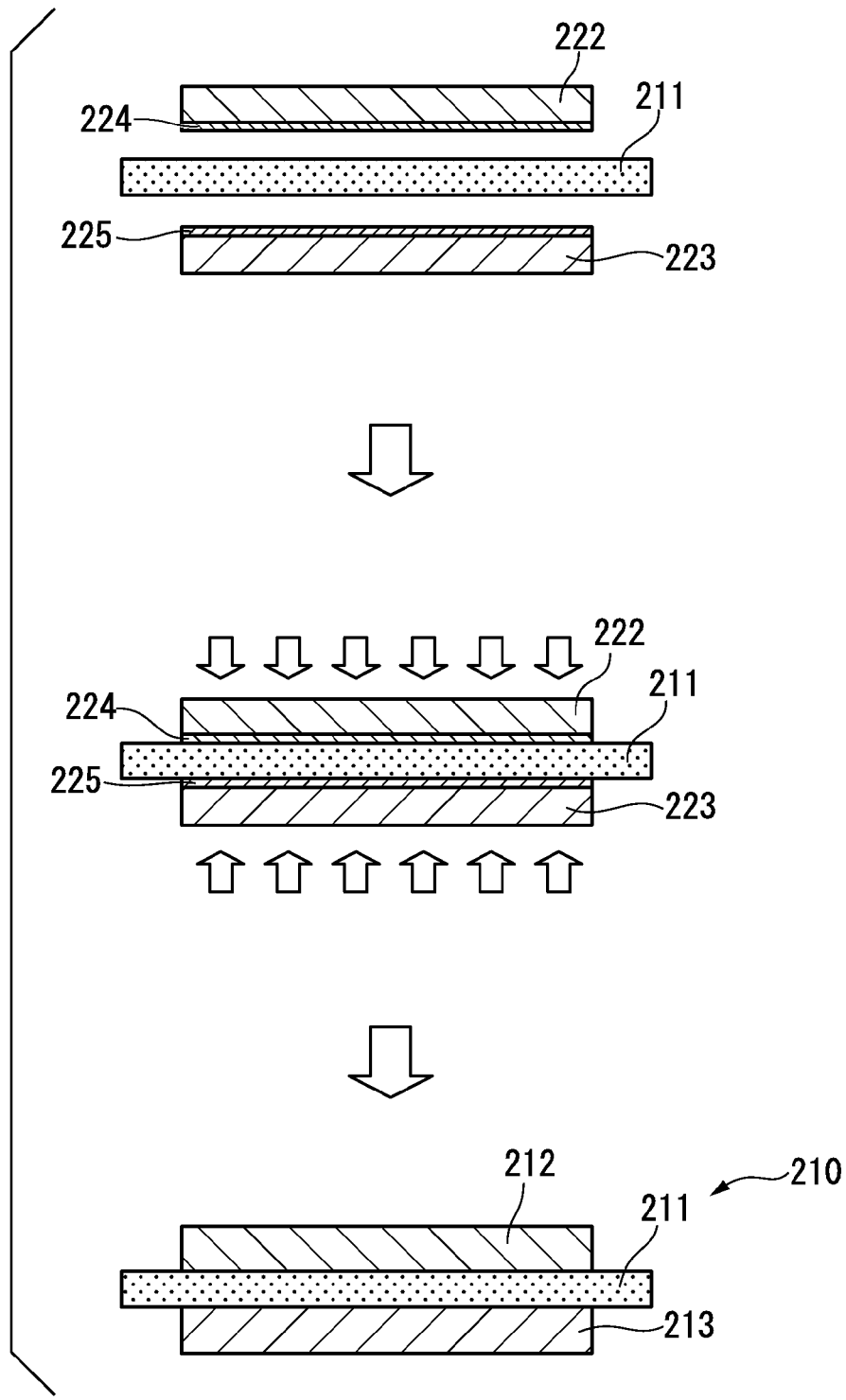
FIG. 13 is an explanatory diagram showing the method for producing the substrate for a power module with a heat sink according to the third embodiment of the present invention.

At first, as shown in FIG. 13, Cu is fixed to one surface of the metal plate 222 serving as the circuit layer 212 by sputtering to form a first Cu layer 224. Moreover, Cu is fixed to one surface of the metal plate 223 serving as the metal layer 213 by sputtering to form a second Cu layer 225. One or more kinds of additive elements selected from Zn, Ge, Ag, Mg, Ca, Ga, and Li are fixed in addition to Cu to the first Cu layer 224 and the second Cu layer 225. In the present embodiment, Ag is used as the additive element.

Here, in the present embodiment, the amount of Cu in the first Cu layer 224 and the second Cu layer 225 is set to a range of from 0.08 mg/cm$^2$ to 2.7 mg/cm$^2$ inclusive. Moreover, the amount of Ag is set to a range of from 0.08 mg/cm$^2$ to 5.4 mg/cm$^2$ inclusive.

(Ceramic Substrate Laminating Step S202)

Subsequently, as shown in FIG. 13, the metal plate 222 is laminated on one surface of the ceramic substrate 211. At this time, the metal plate 222 is laminated so that the surface of the metal plate 222, on which the first Cu layer 224 is formed, faces the ceramic substrate 211.

Moreover, the metal plate 223 is laminated on the other surface of the ceramic substrate 211. At this time, the metal plate 223 is laminated so that the surface of the metal plate 223, on which the second Cu layer 225 is formed, faces the ceramic substrate 211.

(Ceramic Substrate Heating Step S203)

Subsequently, the metal plate 222, the ceramic substrate 211, and the metal plate 223 are charged into a vacuum heating furnace and heated in a pressed state in the lamination direction (with a pressure of 1 to 35 kgf/cm$^2$). A first molten metal area is formed in the interface between the metal plate 222 and the ceramic substrate 211. A second molten metal area is formed in the interface between the metal plate 223 and the ceramic substrate 211.

Here, in the present embodiment, the pressure in the vacuum heating furnace is set to a range of from $10^{-6}$ Pa to $10^{-3}$ Pa inclusive. The heating temperature is set to a range of from 600° C. to 650° C. inclusive.

(First Molten Metal and Second Molten Metal Solidifying Step S204)

Subsequently, the temperature is maintained constant in a state with the first molten metal area and the second molten metal area being formed. Then, Cu and Ag in the first molten metal area and the second molten metal area are diffused toward the metal plates 222 and 223. Consequently, Cu concentration and Ag concentration in the portion being the first and second molten metal areas, gradually decrease to increase the melting point, and solidification proceeds in a state with the temperature being maintained constant. As a result, the ceramic substrate 211 and the metal plates 222 and 223 are bonded and the power module substrate 210 is produced.

(Cu Layer Forming Step S205)

Subsequently, Cu and Ag are fixed to the other surface of the metal layer 213 by sputtering to form a Cu layer 226. Here, in the present embodiment, the amount of Cu in the Cu layer 226 is set to a range of from 0.08 mg/cm$^2$ to 2.7 mg/cm$^2$ inclusive, and the amount of Ag is set to a range of from 0.08 mg/cm$^2$ to 5.4 mg/cm$^2$ inclusive.

(Heat Sink Laminating Step S206)

Subsequently, as shown in FIG. 14, the top board 241, the corrugated fins 246, and the bottom board 245 constituting the heat sink 240 are laminated on the other surface of the metal layer 213 of the power module substrate 210. At this time, the top board 241 and the bottom board 245 are laminated so that the bonding layer 241B of the top board 241 and the bonding layer 245B of the bottom board 245 face the corrugated fins 246. Moreover, flux (not shown) containing, for example, KAlF$_4$ as a main component is interposed between the top board 241 and the corrugated fins 246, and between the bottom board 245 and the corrugated fins 246.

Furthermore, the surface of the metal plate 223, on which the Cu layer 226 is formed, is arranged so as to face the top board 241 of the heat sink 240, and the Cu layer 226 is interposed between the metal plate 223 and the heat sink 240.

(Heat Sink Heating Step S207)

Subsequently, the laminated power module substrate 210, the top board 241, the corrugated fins 246, and the bottom board 245 are charged into an atmosphere heating furnace and heated in a pressed state in the lamination direction (with a pressure of 1 to 35 kgf/cm$^2$), to form a molten metal area between the metal plate 223 and the top board 241 of the heat sink 240. Simultaneously, a molten metal layer in which the bonding layers 241B and 245B are melted is also formed between the top board 241 and the corrugated fins 246 and between the bottom board 245 and the corrugated fins 246.

Here, in the present embodiment, the inside of the atmosphere heating furnace is a nitrogen gas atmosphere, and the heating temperature is set to a range of from 550° C. to 630° C. inclusive.

(Molten Metal Solidifying Step S208)

Subsequently, the temperature is maintained constant in a state with the molten metal area being formed. Then, Cu and Ag in the molten metal area diffuse toward the metal plate 223 and the top board 241 of the heat sink 240. Then, Cu concentration and Ag concentration in the portion being the molten metal area, gradually decrease to increase the melting point, and solidification proceeds in a state with the temperature being maintained constant. That is to say, the top board 241 of the heat sink 240 and the metal plate 223 are bonded by the so-called transient liquid phase diffusion bonding. After solidification has proceeded, cooling is performed down to the normal temperature.

The molten metal layer formed between the top board 241 and the corrugated fins 246, and between the bottom board 245 and the corrugated fins 246 is solidified, thereby brazing the top board 241 and the corrugated fins 246, and the bottom board 245 and the corrugated fins 246. At this time, an oxide layer is respectively formed on the surfaces of the top board 241, the corrugated fins 246, and the bottom board 245. However, these oxide layers are removed by the aforementioned flux.

In this manner, the top board 241, the corrugated fins 246, and the bottom board 245 are brazed to form the heat sink 240. Moreover, the substrate for a power module with a heat sink according to the present embodiment is produced by bonding the heat sink 240 and the power module substrate 210.

In the present embodiment having the above-described configuration, Ag is fixed together with Cu to between the heat sink 240 and the metal layer 213, and Cu and Ag are diffused to form the molten metal area. Moreover, the heat sink 240 and the power module substrate 210 are bonded by diffusing Cu and Ag in the molten metal area. As a result, even under a relatively low temperature condition, the heat sink 240 and the power module substrate 210 can be reliably bonded.

Here, when the heat sink 240 is formed by brazing using the flux, the heat sink 240 is bonded under a temperature condition of from 550° C. to 630° C. inclusive in the nitrogen gas atmosphere. In the present embodiment, the heat sink 240 and the power module substrate 210 can be bonded under the low temperature condition and in the nitrogen gas atmosphere. Consequently, the heat sink 240 can be produced by bonding the top board 241, the corrugated fins 246, and the bottom board 245 by brazing, simultaneously with the bonding of the heat sink 240 and the power module substrate 210. As a result, a manufacturing step of the substrate for a power module with a heat sink can be omitted, and the manufacturing cost can be reduced.

Next, a substrate for a power module with a heat sink, and a power module, according to a fourth embodiment of the present invention will be explained with reference to FIG. 15 to FIG. 18.

A power module 301 includes; a power module substrate 310 having a circuit layer 312 arranged thereon, a semiconductor chip 3 bonded to the surface of the circuit layer 312 via a solder layer 2, and a heat sink 340.

The power module substrate 310 includes; a ceramic substrate 311, the circuit layer 312 arranged on one surface (upper surface in FIG. 15) of the ceramic substrate 311, and a metal layer 313 arranged on the other surface (lower surface in FIG. 15) of the ceramic substrate 311. The ceramic substrate 311 is made of AlN (aluminum nitride) having high insulation properties.

The circuit layer 312 is formed by bonding a metal plate 322 made of a rolled sheet containing aluminum of 99.99% purity or higher to the ceramic substrate 311.

The metal layer 313 is formed by bonding a metal plate 323 made of a rolled sheet containing aluminum of 99.99% purity or higher to the ceramic substrate 311.

The heat sink 340 is for cooling the power module substrate 310. The heat sink 340 according to the present embodiment includes; a top board 341 to be bonded to the power module substrate 310, a bottom board 345 arranged so as to face the top board 341, and corrugated fins 346 placed between the top board 341 and the bottom board 345. Flow channels 342 through which a cooling medium is circulated are defined by the top board 341, the bottom board 345, and the corrugated fins 346.

Here, the heat sink 340 is formed by brazing the top board 341 and the corrugated fins 346, and the corrugated fins 346 and the bottom board 345, respectively.

In a bonding interface between the top board 341 of the heat sink 340 and the metal layer 313 (metal plate 323), one or more kinds of additive elements selected from Zn, Ge, Ag, Mg, Ca, Ga, and Li are solid-solubilized in addition to Cu into the metal layer 313 (metal plate 323) and the top board 341. In the present embodiment, Ag is solid-solubilized as the additive element.

Moreover, in a bonding interface between the circuit layer 312 (metal plate 322) and the ceramic substrate 311 and in a bonding interface between the metal layer 313 (metal plate 323) and the ceramic substrate 311, one or more kinds of additive elements selected from Zn, Ge, Ag, Mg, Ca, Ga, and Li are solid-solubilized in addition to Cu, and in the present embodiment, Ag is solid-solubilized as the additive element.

A method for producing the substrate for a power module with a heat sink having the described configuration will be explained below.

(Fixing Layer Forming Step S301)

Figure 17:
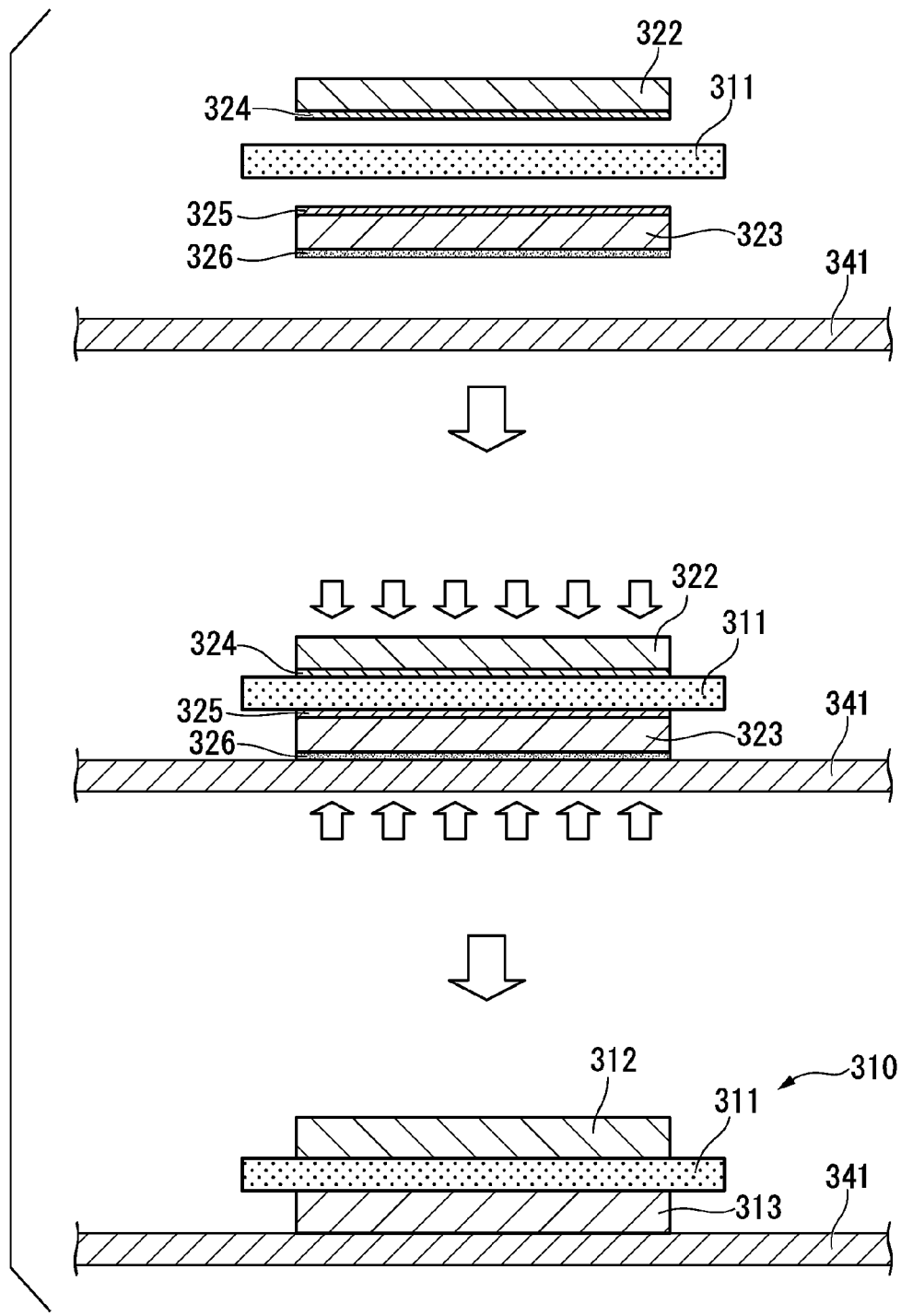
FIG. 17 is an explanatory diagram showing the method for producing the substrate for a power module with a heat sink according to the fourth embodiment of the present invention.

At first, as shown in FIG. 17, Cu is fixed to one surface of the metal plate 322 serving as the circuit layer 312 by sputtering to form a first Cu layer 324. Moreover, Cu is fixed to one surface of the metal plate 323 serving as the metal layer 313 by sputtering to form a second Cu layer 325. Furthermore, Cu is fixed to the other surface of the metal plate 323 by sputtering to form a Cu layer 326.

One or more kinds of additive elements selected from Zn, Ge, Ag, Mg, Ca, Ga, and Li are fixed in addition to Cu to the first Cu layer 324, the second Cu layer 325, and the Cu layer 326. In the present embodiment, Ag is used as the additive element.

Here, in the present embodiment, the amount of Cu in the first Cu layer 324, the second Cu layer 325, and the Cu layer 326 is set to a range of from 0.08 mg/cm$^2$ to 2.7 mg/cm$^2$ inclusive. Moreover, the amount of Ag is set to a range of from 0.08 mg/cm$^2$ to 5.4 mg/cm$^2$ inclusive.

(Laminating Step S302)

Subsequently, as shown in FIG. 17, the metal plate 322 is laminated on one surface of the ceramic substrate 311. At this time, the metal plate 322 is laminated so that the surface of the metal plate 322, on which the first Cu layer 324 is formed, faces the ceramic substrate 311. Moreover, the metal plate 323 is laminated on the other surface of the ceramic substrate 311. At this time, the metal plate 323 is laminated so that the surface of the metal plate 323, on which the second Cu layer 325 is formed, faces the ceramic substrate 311.

Furthermore, the top board 341 is arranged and laminated on the surface of the metal plate 323, on which the Cu layer 326 is formed.

(Heating Step S303)

Subsequently, the metal plate 322, the ceramic substrate 311, the metal plate 323, and the top board 341 are charged into a vacuum heating furnace and heated in a pressed state in the lamination direction (with a pressure of 1 to 35 kgf/cm$^2$). A first molten metal area is formed in the interface between the metal plate 322 and the ceramic substrate 311. A second molten metal area is formed in the interface between the metal plate 323 and the ceramic substrate 311. A molten metal area is formed between the metal plate 323 and the top board 341.

Here, in the present embodiment, the pressure in the vacuum heating furnace is set to a range of from $10^{-6}$ Pa to $10^{-3}$ Pa inclusive. The heating temperature is set to a range of from 600° C. to 650° C. inclusive.

(Molten Metal Solidifying Step S304)

Subsequently, the temperature is maintained constant in a state with the first molten metal area and the second molten metal area being formed. Then, Cu and Ag in the first molten metal area and the second molten metal area diffuse toward the metal plates 322 and 323. Then, Cu concentration and Ag concentration in a portion, which has been the first molten metal area and the second molten metal area, gradually decrease to increase the melting point, and solidification proceeds in a state with the temperature being maintained constant. As a result, the ceramic substrate 311 and the metal plates 322 and 323 are bonded.

Moreover, the temperature is maintained constant in a state with the molten metal area being formed. Then, Cu and Ag in the molten metal area diffuse toward the metal plate 323 and the top board 341. Then, Cu concentration and Ag concentration in the portion being the molten metal area, gradually decrease to increase the melting point, and solidification proceeds in a state with the temperature being maintained constant. As a result, the metal plate 323 and the top board 341 are bonded.

(Fin Laminating Step S305)

Figure 18:
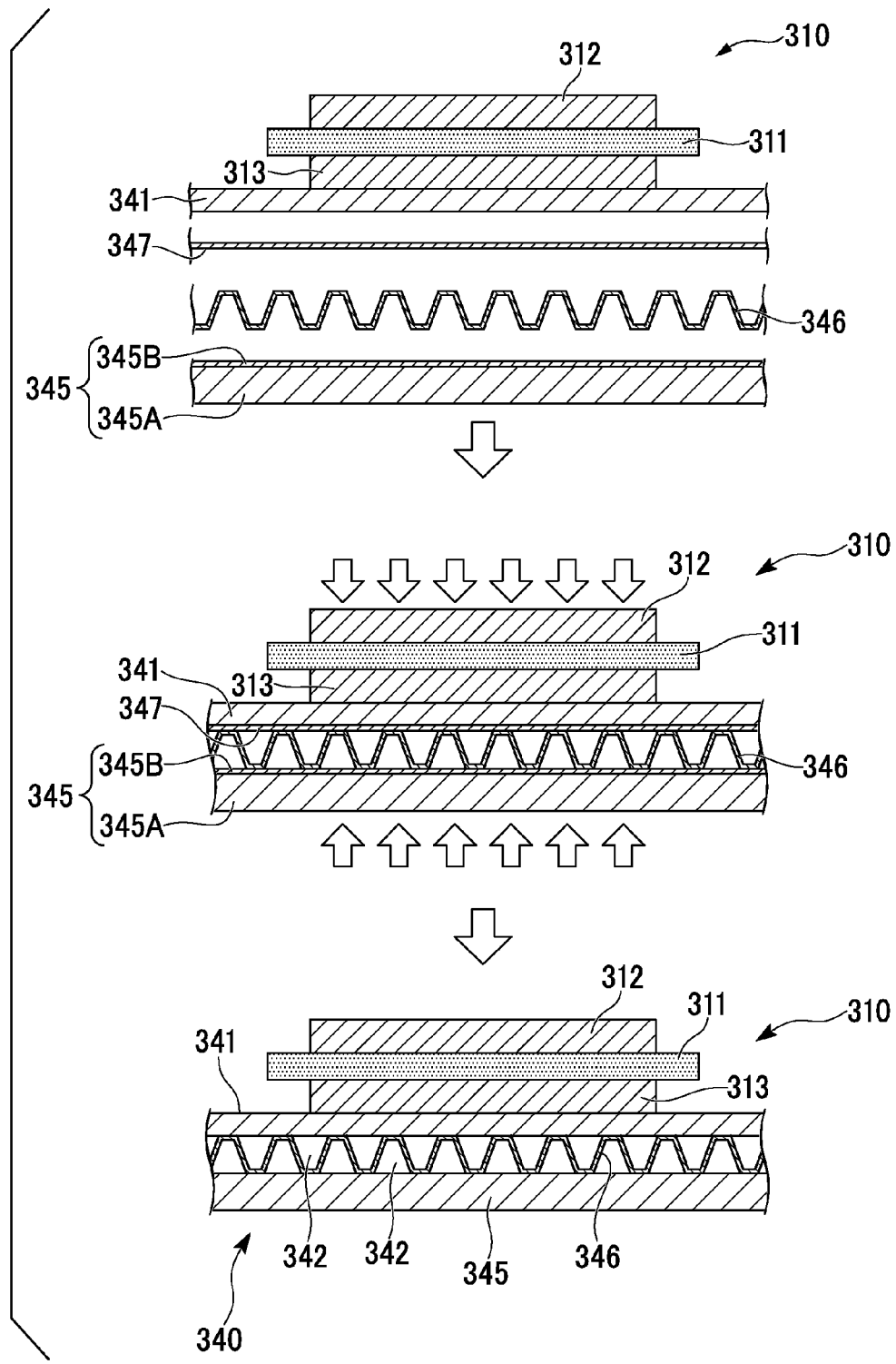
FIG. 18 is an explanatory diagram showing the method for producing the substrate for a power module with a heat sink according to the fourth embodiment of the present invention.

Subsequently, as shown in FIG. 18, a brazing filler metal foil 347 (for example, low-melting-point aluminum alloy foil such as Al-10% Si alloy foil), the corrugated fins 346, and the bottom board 345 are laminated on the other surface side of the top board 341. At this time, the bottom board 345 is laminated so that a bonding layer 345B of the bottom board 345 faces the corrugated fins 346. Moreover, flux (not shown) containing, for example, KAlF$_4$ as a main component is interposed between the top board 341 and the corrugated fins 346, and between the bottom board 345 and the corrugated fins 346.

(Brazing Step S306)

Subsequently, the top board 341, the corrugated fins 346, and the bottom board 345 are charged into an atmosphere heating furnace and heated in a pressed state in the lamination direction (with a pressure of 1 to 35 kgf/cm$^2$). A molten metal layer in which the brazing filler metal foil 347 and the bonding layer 345B are melted is formed between the top board 341 and the corrugated fins 346, and between the bottom board 345 and the corrugated fins 346.

Here, in the present embodiment, the inside of the atmosphere heating furnace is a nitrogen gas atmosphere, and the heating temperature is set to a range of from 550° C. to 630° C. inclusive.

The molten metal layer formed between the top board 341 and the corrugated fins 346 and between the bottom board 345 and the corrugated fins 346 is solidified by cooling, thereby brazing the top board 341 and the corrugated fins 346, and the bottom board 345 and the corrugated fins 346 together. At this time, an oxide layer is respectively formed on the surfaces of the top board 341, the corrugated fins 346, and the bottom board 345. However, these oxide layers are removed by the aforementioned flux.

In this manner, the substrate for a power module with a heat sink according to the present embodiment is produced.

In the present embodiment having the above-described configuration, Ag is fixed together with Cu to between the top board 341 of the heat sink 340 and the metal layer 313, and Cu and Ag are diffused to form the molten metal area. Moreover, the top board 341 of the heat sink 340 and the power module substrate 310 are bonded by diffusing Cu and Ag in the molten metal area. As a result, even under a relatively low temperature condition, the top board 341 of the heat sink 340 and the power module substrate 310 can be reliably bonded.

The embodiments of the present invention have been explained above. However, the present invention is not limited thereto, and can be appropriately changed without departing from the technical concept of the present invention.

For example, it has been explained that the metal plate serving as the circuit layer and the metal layer is a rolled sheet containing aluminum of 99.99% purity. However, the metal plate is not limited thereto, and it can be aluminum having a purity of 99% (2N aluminum).

Moreover, it has been explained that the ceramic substrate is made of AlN. However, the ceramic substrate is not limited thereto, and it can be made of other ceramics such as $Si_3N_4$ or $Al_2O_3$.

Furthermore, in the second, third, and fourth embodiments, it has been explained that in the Cu layer forming step, Ge or Ag is fixed as the additive element. However, the present invention is not limited thereto. One or more kinds of elements selected from Si, Zn, Ge, Ag, Mg, Ca, Ga, and Li can be used as the additive element. Here, the total fixation amount of Cu and the additive element is preferably set to a range of from 0.08 $mg/cm^2$ to 10 $mg/cm^2$ inclusive.

For example, when Si is used as the additive element, it is desired that a fixation amount of Cu in the Cu layer forming step is set to a range of from 0.08 $mg/cm^2$ to 2.7 $mg/cm^2$ inclusive, and a fixation amount of Si is set to a range of from 0.002 $mg/cm^2$ to 1.2 $mg/cm^2$ inclusive Moreover, in the Cu layer forming step, it has been explained that Cu is fixed to the other surface of the metal plate serving as the metal layer. However, the present invention is not limited thereto, and Cu can be fixed to the bonding surface of the heat sink. Cu can be also fixed, respectively, to the bonding surface of the heat sink and the other surface of the metal plate.

Furthermore, in the Cu layer forming step, it has been explained that Cu and the additive element are fixed by sputtering. However, the fixing method is not limited thereto, and Cu can be fixed by plating, evaporation, CVD, cold spray, or application of ink and a paste in which powder is dispersed.

Also, in the Cu layer forming step, Al can be fixed together with Cu.

In these embodiments, further, it has been explained that one power module substrate is bonded on the heat sink. However, the present invention is not limited thereto, and a plurality of power module substrates may be bonded on one heat sink.

Moreover, in the first and second embodiments, it has been explained that the heat sink and the metal layer (metal plate) are bonded by using the vacuum heating furnace. However, the bonding method is not limited thereto, and the heat sink and the metal layer (metal plate) may be bonded in a $N_2$ atmosphere, Ar atmosphere, He atmosphere, or the like.

Furthermore, it has been explained that the ceramic substrate and the metal plate are bonded without using the brazing filler metal foil. However, the present invention is not limited thereto, and a power module substrate in which the ceramic substrate and the metal plate are bonded by using the brazing filler metal foil may be used.

In the third embodiment, further, it has been explained that the top board and the bottom board are made of laminated aluminum board including a base material layer and a bonding layer. However, these boards are not limited thereto, and the corrugated fins can be formed of a clad material including, for example, a core made of A3003 and bonding layers made of A4045 on opposite sides of the core. In this case, a simple aluminum plate can be used for the top board and the bottom board.

Moreover, the materials of the top board, the corrugated fins, and the bottom board are not limited to these embodiments.

Furthermore, the structure of the heat sink including the shape of the corrugated fins and the like is not limited to the one explained in these embodiments. For example, only the top board in the third and fourth embodiments may be bonded to the power module substrate as a radiator plate.

Figure 19:
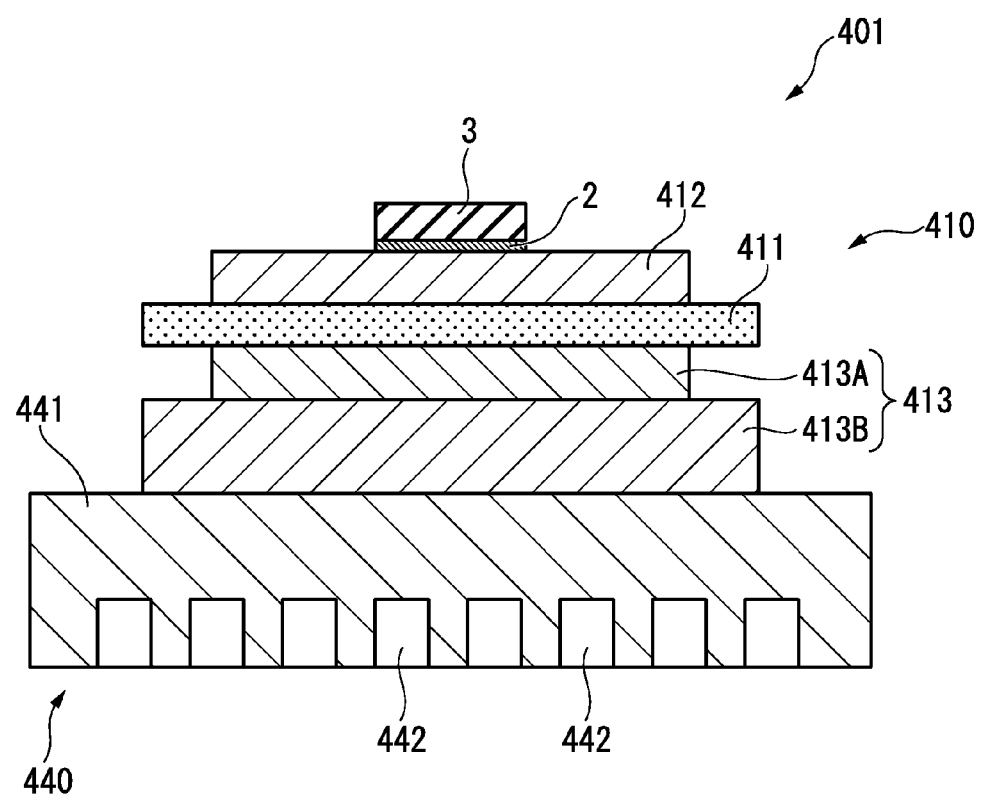
FIG. 19 is a schematic explanatory diagram of a power module using a substrate for a power module with a heat sink according to another embodiment of the present invention.

Furthermore, as shown in FIG. 19, a second metal plate 413 may have a structure including a plurality of metal plates 413A and 413B laminated on each other. In this case, the metal plate 413A of the second metal plates 413 positioned on one side (upper side in FIG. 19) is bonded to a ceramic substrate 411, and the metal plate 413B positioned on the other side (lower side in FIG. 19) is bonded to a top board 441 of a heat sink 440. A Cu layer is formed between the metal plate 413B positioned on the other side and the top board 441 of the heat sink 440, thereby bonding the metal plate 413B positioned on the other side and the top board 441 of the heat sink 440. Here, the second metal plate 413 can be formed by bonding the laminated metal plates 413A and 413B via the Cu layer. In FIG. 19, the two metal plates 413A and 413B are laminated. However, the number of metal plates to be laminated is not limited. Moreover, as shown in FIG. 19, the size and shape of the metal plates to be laminated can be different, or can be adjusted to the same size and the same shape. Furthermore, the composition of these metal plates can be different.

INDUSTRIAL APPLICABILITY

According to a method for producing a power module with a heat sink of the present invention, even if bonding is performed under bonding conditions of relatively low temperature and a short period of time, the heat sink and the second metal plate can be firmly bonded.

BRIEF DESCRIPTION OF REFERENCE SYMBOLS 10, 110, 210, 310, 410 Power module substrate
11, 111, 211, 311, 411 Ceramic substrate
12, 112, 212, 312, 412 Circuit layer (first metal plate)
13, 113, 213, 313, 413 Metal layer (second metal plate)
40, 140, 240, 340, 440 Heat sink
24, 124, 224, 324 First Cu layer (first metal layer)
25, 125, 225, 325 Second Cu layer (second metal layer)
26, 126, 226, 326 Cu layer
27 First molten metal area
28 Second molten metal area 29 Molten metal area
30, 130, 230 Bonding interface

The invention claimed is:

1. A substrate for a power module with a heat sink comprising;
a ceramic substrate,
a first metal plate made of aluminum with one surface being bonded to a surface of said ceramic substrate,
a second metal plate made of aluminum with one surface being bonded to a rear surface of said ceramic substrate, and
a heat sink made of aluminum or aluminum alloy and bonded to the other surface of said second metal plate, which is opposite to said one surface bonded to said ceramic substrate,
and Cu is solid-solubilized into said second metal plate and said heat sink, and a Cu concentration at a position of 50 μm from a bonding surface between said second metal plate and said heat sink is set to a range of from 0.05% by mass to 5% by mass inclusive.

2. A substrate for a power module with a heat sink according to claim 1, wherein one or more kinds of additive elements selected from Si, Zn, Ge, Ag, Mg, Ca, Ga, and Li are solid-solubilized in addition to Cu into said second metal plate and said heat sink.

3. A substrate for a power module with a heat sink according to claim 1, wherein one or more kinds of additive elements selected from Zn, Ge, Ag, Mg, Ca, Ga, and Li are solid-solubilized in addition to at least one of Cu and Si into the vicinity of a bonding interface between said first metal plate and said ceramic substrate or the vicinity of a bonding interface between said second metal plate and said ceramic substrate.

4. A substrate for a power module with a heat sink according to claim 1, wherein a thickness of said second metal plate is set to be thicker than that of said first metal plate.

5. A substrate for a power module with a heat sink according to claim 1, wherein said second metal plate is formed by laminating a plurality of metal plates.

6. A power module comprising;
the substrate for a power module with a heat sink according to claim 1, and
electronic parts mounted on said substrate for a power module with a heat sink.

* * * * *